United States Patent
Kobatake

(10) Patent No.: US 9,202,553 B2
(45) Date of Patent: Dec. 1, 2015

(54) SEMICONDUCTOR STORAGE DEVICE

(71) Applicant: Renesas Electronics Corporation, Kawasaki-shi (JP)

(72) Inventor: Hiroyuki Kobatake, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/332,219

(22) Filed: Jul. 15, 2014

(65) Prior Publication Data
US 2015/0036420 A1    Feb. 5, 2015

(30) Foreign Application Priority Data
Aug. 5, 2013    (JP) .................. 2013-162107

(51) Int. Cl.
*G11C 11/24*    (2006.01)
*G11C 11/412*    (2006.01)
*H01L 27/02*    (2006.01)
*H01L 27/11*    (2006.01)

(52) U.S. Cl.
CPC .......... *G11C 11/412* (2013.01); *H01L 27/0207* (2013.01); *H01L 27/1104* (2013.01)

(58) Field of Classification Search
CPC ..... G11C 11/419; G11C 11/412; G11C 11/417
USPC ............... 365/156, 154, 150; 257/393
See application file for complete search history.

(56) References Cited

U.S. PATENT DOCUMENTS

| 6,977,837 B2 * | 12/2005 | Watanabe et al. ............. 365/156 |
| 7,113,421 B2 | 9/2006 | Maeda et al. |
| 7,177,177 B2 * | 2/2007 | Chuang et al. ................ 365/154 |
| 7,643,331 B2 | 1/2010 | Inaba |

FOREIGN PATENT DOCUMENTS

| JP | 8-17186 A | 1/1996 |
| JP | 2006-85786 A | 3/2006 |
| JP | 2008-90958 A | 4/2008 |

* cited by examiner

*Primary Examiner* — Andrew Q Tran
(74) *Attorney, Agent, or Firm* — McGinn IP Law Group, PLLC

(57) ABSTRACT

Provided is a semiconductor storage device including first and second load transistors, first and second drive transistors, first and second transfer transistors, and first and second cell node lines each serving as a storage node. A portion where a cell node line and a bit line corresponding to the cell node line overlap each other when viewed from above is formed between the cell node line and the bit line.

12 Claims, 12 Drawing Sheets

SEMICONDUCTOR STORAGE DEVICE

CROSS-REFERENCE TO RELATED APPLICATIONS

This application is based upon and claims the benefit of priority from Japanese patent application No. 2013-162107, filed on Aug. 5, 2013, the disclosure of which is incorporated herein in its entirety by reference.

BACKGROUND

The present invention relates to a semiconductor storage device, and more particularly, to a semiconductor storage device that incorporates, for example, an SRAM (Static Random Access Memory) as a storage cell.

In recent years, the processes for semiconductor devices have become finer. However, as the processes for semiconductor devices have become finer, the driving ability of a single transistor has been decreased, which causes problems such as deterioration in write characteristics and data retention ability of an SRAM (Static Random Access Memory). In this regard, Japanese Unexamined Patent Application Publication Nos. H08-17186, 2006-85786, and 2008-90958, for example, disclose techniques for improving the write characteristics or data retention characteristics of the SRAM.

A semiconductor storage device disclosed in Japanese Unexamined Patent Application Publication No. H08-17186 includes capacitors having one end connected to one side of a storage node of a flip-flop constituting a memory cell, and having the other end connected to a bit line that is connected to the other side of the storage node through a transfer transistor. The semiconductor storage device disclosed in Japanese Unexamined Patent Application Publication No. H08-17186 can improve the data retention ability by providing the capacitors. However, even when the capacitors are provided in the semiconductor storage device, the write operation margin cannot be improved.

A semiconductor storage device disclosed in Japanese Unexamined Patent Application Publication No. 2006-85786 includes a plurality of static memory cells which are provided so as to respectively correspond to a plurality of word lines and a plurality of complementary bit lines; a plurality of memory cell power supply lines which supply an operating voltage for each of a plurality of memory cells respectively connected to the plurality of complementary bit lines; a plurality of power supply circuits including resistor means which supplies a power supply voltage so as to respectively correspond to the memory cell power supply lines; and a precharge circuit which supplies the complementary bit lines with a precharge voltage corresponding to the power supply voltage. The memory cell power supply lines each include a coupling capacitor that receives a write signal from the corresponding complementary bit line. In the semiconductor storage device disclosed in Japanese Unexamined Patent Application Publication No. 2006-85786, the coupling capacitors and the power supply circuits can improve the write operation margin and the data retention ability.

A semiconductor storage device disclosed in Japanese Unexamined Patent Application Publication No. 2008-90958 includes an SRAM cell including first and second drive transistors, which constitute a pair of inverters, and a voltage generation circuit which applies a voltage having a value lower or higher than a ground voltage to one end of a current path of the first and second drive transistors. In the semiconductor storage device disclosed in Japanese Unexamined Patent Application Publication No. 2008-90958, the voltage generation circuit improves the write operation margin and the data retention ability.

SUMMARY

However, in the semiconductor storage devices of the related art disclosed in Japanese Unexamined Patent Application Publication Nos. H08-17186, 2006-85786, and 2008-90958, an element or a circuit should be added to increase the write operation margin, which causes a problem of an increase in circuit size. For example, the semiconductor storage device disclosed in Japanese Unexamined Patent Application Publication No. 2006-85786 incorporates a power supply circuit, and the semiconductor storage device disclosed in Japanese Unexamined Patent Application Publication No. 2008-90958 incorporates a voltage generation circuit.

Other objects and novel features of the invention will become apparent from the following description of the specification and the accompanying drawings thereof.

One aspect of the invention is a semiconductor storage device including first and second load transistors, first and second drive transistors, first and second transfer transistors, and first and second cell node lines each serving as a storage node. A portion where a cell node line and a bit line corresponding to the cell node line overlap each other when viewed from above is formed between the cell node line and the bit line.

According to the one aspect of the invention, the operation margin and data retention ability of the semiconductor storage device can be improved without adding any elements or circuits.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
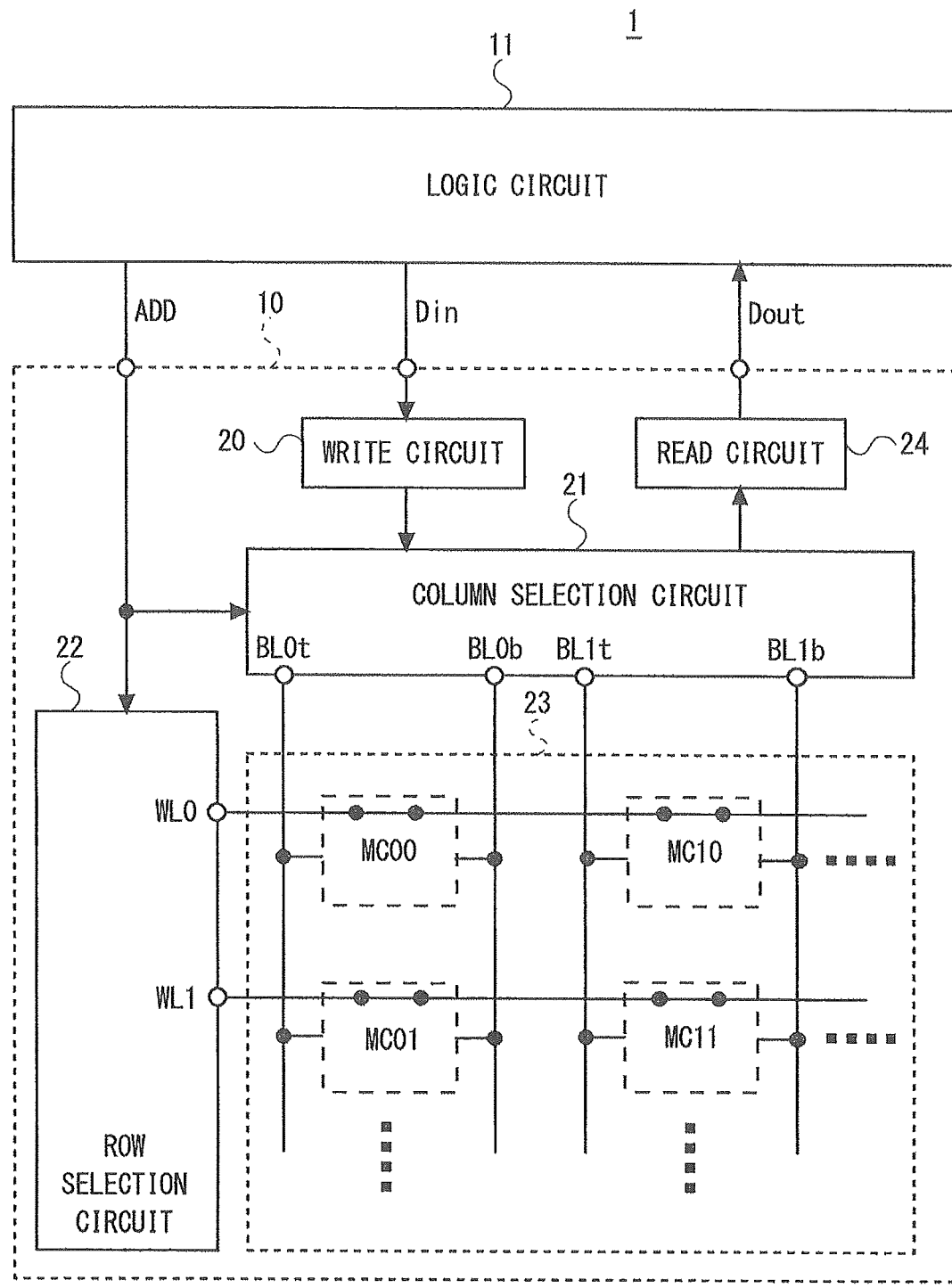
FIG. 1 is a block diagram of a semiconductor device according to a first embodiment.

For the sake of clarity of the description, the following descriptions and the drawings are abbreviated or simplified as appropriate. In the drawings, the same elements are denoted by the same reference numerals, and a repeated explanation is omitted as needed.

A feature of a semiconductor storage device according to an embodiment described below resides in circuits involved in a storage cell of a horizontal SRAM (Static Random Access Memory) (hereinafter referred to as a memory cell) and the layout of the circuits. This memory cell can be used in various implementation forms, for example, a memory cell of a built-in storage device such as an MCU (Micro Control Unit), and a memory cell of a memory, which is individually formed, such as an SRAM module. In the following description, a semiconductor device including a memory cell according to an embodiment will be described as an implementation example.

FIG. 1 shows a block diagram of a semiconductor device 1 (for example, an MCU) including a semiconductor storage device according to a first embodiment. As shown in FIG. 1, the semiconductor device 1 includes a memory 10 and a logic circuit 11. The memory 10 is a storage device used for the logic circuit 11, and the logic circuit 11 executes a program read from the memory 10 or another storage device (not shown).

The memory 10 performs data write processing or data read processing for an access address ADD, based on a control signal and the access address ADD which are output from the logic circuit 11. The memory 10 includes a write circuit 20, a column selection circuit 21, a row selection circuit 22, a memory cell array 23, and a read circuit 24.

The memory cell array 23 includes memory cells MC which are disposed in a lattice shape. In FIG. 1, a number indicating a position is added to each reference symbol to represent the position of each memory cell MC. In FIG. 1, for example, a memory cell disposed in a first row and a first column is denoted by MC00. In the memory cell array 23, each column of the memory cell array is provided with a bit line pair formed of bit lines BLt and BLb. As for the bit lines, in FIG. 1, a number representing the number of each bit line is included in each reference symbol denoting each bit line. In FIG. 1, for example, the bit lines forming a first bit line pair are denoted by BL0t and BL0b, respectively. Further, in the memory cell array 23, each row of the memory cell array is provided with a word line WL. As for the word lines, in FIG. 1, a number representing the number of each word line is included in each reference symbol denoting each bit line. In FIG. 1, for example, a first word line is denoted by WL0. If there is no need to specifically designate the number in the following description, the word lines, the bit lines, and the memory cells are denoted by WL, BLt and BLb, and MC, respectively.

The write circuit 20 receives write data Din from the logic circuit 11, drives the bit line pair, and writes the data into the memory cell MC. The column selection circuit 21 selects the bit line pair corresponding to the access address ADD, and connects the selected bit line pair with the write circuit 20 or the read circuit 24. The row selection circuit 22 drives the word line corresponding to the access address ADD, and activates the memory cell MC disposed in the row corresponding to the driven word line. The read circuit 24 outputs the data, which is read from the memory cell array 23 through the column selection circuit 21, to the logic circuit 11 as read data Dout.

Figure 2:
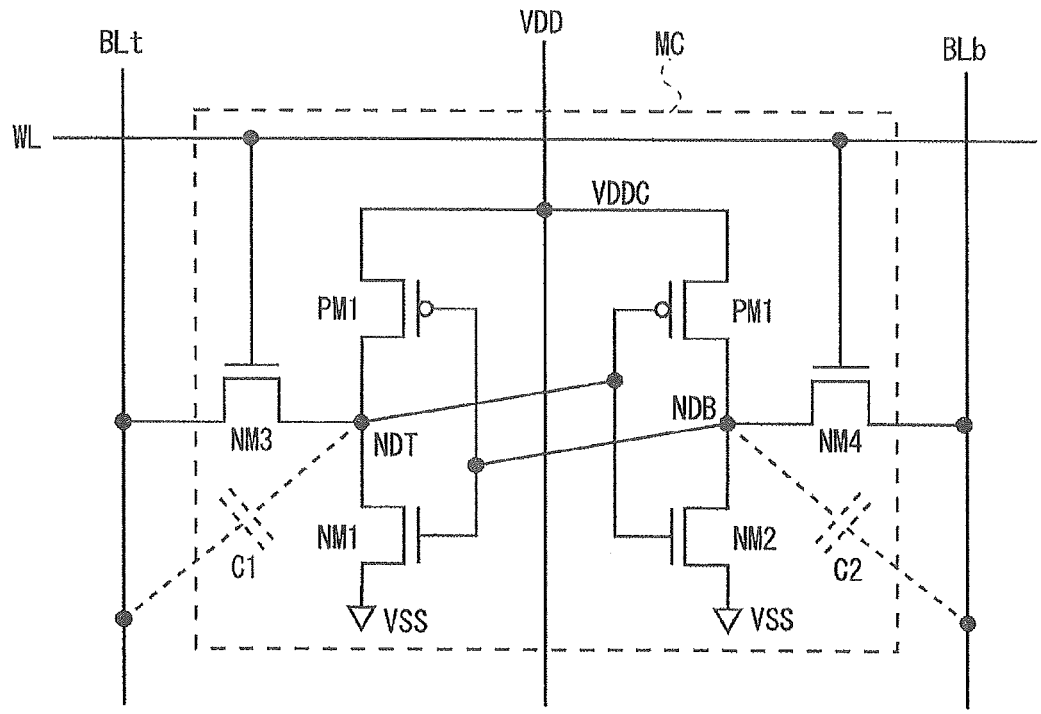
FIG. 2 is a circuit diagram of a memory cell of a semiconductor storage device according to the first embodiment.

A feature of the semiconductor storage device (for example, the memory 10) according to the first embodiment resides in the circuit configuration of each memory cell MC and the layout of each memory cell MC. FIG. 2 shows a circuit diagram of a memory cell MC of the semiconductor storage device according to the first embodiment.

As shown in FIG. 2, the memory cell MC includes a first load transistor PM1, a second load transistor PM2, a first drive transistor NM1, a second drive transistor NM2, a first transfer transistor NM3, and a second transfer transistor NM4. The memory cell MC also includes a first cell node line NDT, a second cell node line NDB, a first capacitor C1, and a second capacitor C2.

The source of the first load transistor PM1 and the source of the second load transistor PM2 are connected to a first power supply line (for example, a power supply line VDDC within the cell) which is supplied with a first power supply voltage (for example, a power supply voltage VDD). The drain of the first load transistor PM1 is connected to the drain of the first drive transistor NM1. A node between the first load transistor PM1 and the first drive transistor NM1 is a first cell node where the positive-side data of the memory cell MC is stored. The drain of the second load transistor PM2 is connected to the drain of the second drive transistor NM2. The source of the first drive transistor NM1 and the source of the second drive transistor NM2 are connected to a second power supply line (for example, a ground line) which is supplied with a second power supply voltage (for example, a ground voltage VSS).

The gate of the first load transistor PM1 and the gate of the first drive transistor NM1 are connected to each other. One terminal of the source and drain (hereinafter referred to simply as one terminal) of the first transfer transistor NM3 is connected to the drain of the first drive transistor, and the other terminal of the source and drain (hereinafter referred to simply as the other terminal) of the first transfer transistor NM3 is connected to the first bit line BLt. The gate of the first transfer transistor NM3 is connected to the word line WL. The first cell node line NDT connects the drain of the first load transistor PM1, the drain of the first drive transistor NM1, the gate of the second load transistor PM2, the gate of the second drive transistor NM2, and one terminal of the first transfer transistor NM3 to each other.

The gate of the second load transistor PM2 and the gate of the second drive transistor NM2 are connected to each other. One terminal of the second transfer transistor NM4 is connected to the drain of the first drive transistor, and another terminal of the second transfer transistor NM4 is connected to the second bit line BLb. The gate of the second transfer transistor NM4 is connected to the word line WL. The second cell node line NDB connects the drain of the second load transistor PM2, the drain of the second drive transistor NM2, the gate of the first load transistor PM1, the gate of the first drive transistor NM1, and one terminal of the second transfer transistor NM4 to each other.

The first capacitor C1 is formed between the first cell node line NDT and the first bit line BLt. The second capacitor C2 is formed between the second cell node line NDB and the second bit line BLb. As described in detail later, the first capacitor C1 and the second capacitor C2 are parasitic capacitances between lines that are formed in different wiring layers.

Figure 3:
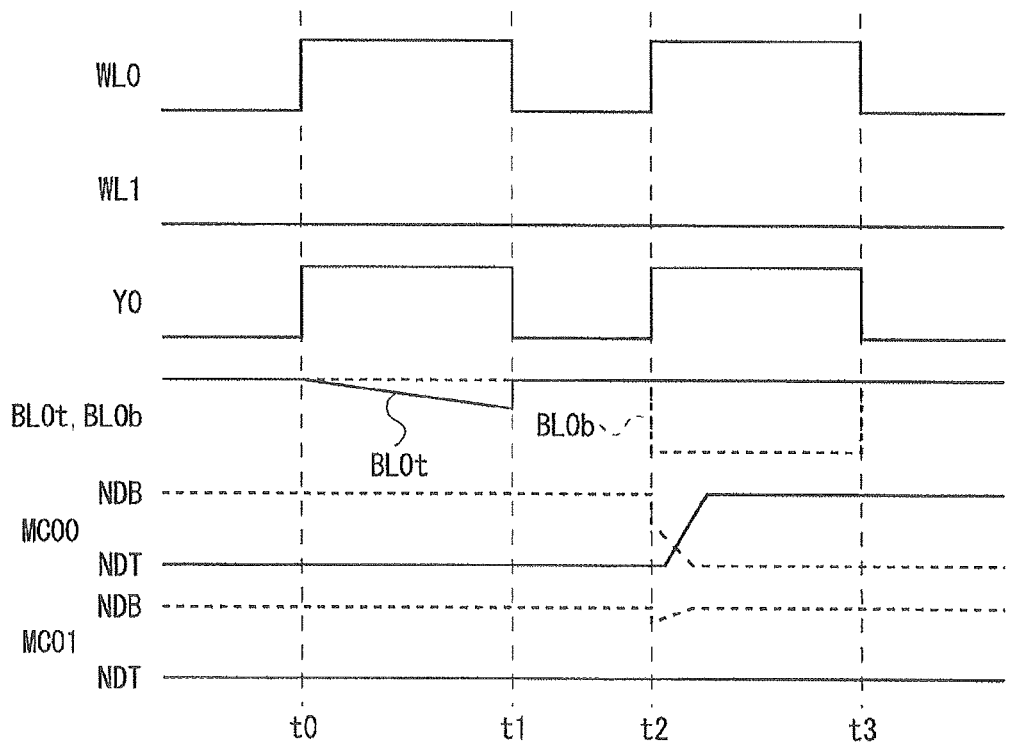
FIG. 3 is a timing diagram showing an operation of the semiconductor storage device according to the first embodiment.

An operation of the semiconductor storage device according to the first embodiment will now be described. FIG. 3 is a timing diagram showing an operation of the semiconductor storage device according to the first embodiment. In the example shown in FIG. 3, write processing and read processing are performed on a memory cell MC00 from among the memory cells MC00 and MC01 connected to the first bit line pair (bit lines BL0t and BL0b).

In the example shown in FIG. 3, data read processing is performed during a period from timing t0 to timing t1. In the data read processing, the word line WL0 and a selection signal Y0 become a high level according to the access address ADD. This renders the first transfer transistor NM3 and the second transfer transistor NM4 of the memory cell MC00 conductive. The potential of the bit line BL0t decreases according to the voltage of the cell node NDT of the memory cell MC00. The read circuit 24 amplifies a voltage difference between the bit lines BL0t and BL0b and outputs the amplified voltage difference to the logic circuit 11.

In the example shown in FIG. 3, data write processing is performed during a period from timing t2 and timing t3. In the data write processing, the word line WL0 and the selection signal Y0 become the high level according to the access address ADD. Accordingly, the bit lines BL0t and BL0b are connected to the write circuit 20, and the bit line BL0t changes to the high level (power supply voltage level, for example) according to the logical level of the write data Din and the bit line BL0b changes to a low level (ground voltage level, for example). Further, the first transfer transistor NM3 and the second transfer transistor NM4 of the memory cell MC00 are rendered conductive.

In this case, prior to timing t2, the voltage of the first cell node line NDT of the memory cell MC00 is at the low level and the voltage of the second cell node line NDB is at the high level. Therefore, in accordance with the start of the write processing at timing t2, the voltage of the second cell node line NDB decreases according to the voltage of the bit line BL0b, and the voltage of the first cell node line NDT increases according to the voltage of the bit line BL0t. At this time, in the semiconductor storage device according to the first embodiment, the voltage of the second cell node line NDB and the voltage of the bit line BL0b are at the high level during the period prior to timing t2, so that no electric charges are stored in the second capacitor C2. Accordingly, at the start of writing at timing t2, the voltage of the second cell node line NDB is forcibly decreased by the second capacitor C2. As a result, in the semiconductor device according to the first embodiment, the first drive transistor NM1 rapidly turns off and the first load transistor PM1 turns on. The voltage of the first cell node line NDT is caused to change according to the change in the voltage of the second cell node line NDB. When the writing is completed (timing t3), the voltage held in each of the first cell node line NDT and the second cell node line NDB indicates an inverted logical level with respect to that at timing t2 prior to the write processing. Specifically, at timing t3, the voltage of the first cell node line NDT becomes the high level and the voltage of the second cell node line NDB becomes the low level.

The effect of decreasing the cell node voltage at the start of writing in the memory cell MC according to the first embodiment will now be described in detail. Assuming that the capacitance value of the second capacitor C2 is represented by C2 and the parasitic capacitance of the source or drain connected to the cell node line is represented by Cn, when the power supply voltage is VDD, a decreased voltage dV of the cell node voltage can be expressed by the following expression (1).

$$dV = (C2/(Cn+C2)) \times VDD \quad (1)$$

In the memory cell MC according to the first embodiment, Cn:C2=1:0.03–0.08 can be satisfied. Accordingly, in the memory cell MC according to the first embodiment, when the power supply voltage is 1 V, the effect of decreasing the cell node voltage to a decreased voltage dV of about 30 mV to 80 mV can be achieved.

On the other hand, for example, in the semiconductor storage device disclosed in Japanese Unexamined Patent Application Publication No. 2006-85786, a capacitor is added between a power supply line and a bit line (see FIG. 3 in Japanese Unexamined Patent Application Publication No. 2006-85786). The capacitance value of the capacitor is represented by C, and C2 in the expression (1) is replaced by C, thereby obtaining the decreased voltage of the cell node at the start of writing in the semiconductor storage device disclosed in Japanese Unexamined Patent Application Publication No. 2006-85786. The ratio between the capacitance value C and the parasitic capacitance Cn in Japanese Unexamined Patent Application Publication No. 2006-85786 is about Cn C=1:

0.01–0.02. Accordingly, in the semiconductor storage device disclosed in Japanese Unexamined Patent Application Publication No. 2006-85786, the decreased voltage dV of the cell node voltage at the start of writing is about 10 mV to 20 mV.

In other words, in the memory cell MC according to the first embodiment, the decreased voltage dV of the cell node voltage at the start of writing can be tripled or quadrupled as compared with the semiconductor storage device disclosed in Japanese Unexamined Patent Application Publication No. 2006-85786.

As described above, in the memory cell of the semiconductor storage device according to the first embodiment, each capacitor is provided between a cell node line and a bit line connected to the cell node line. Accordingly, the semiconductor storage device according to the first embodiment can facilitate the transition of the voltage of the cell node line from the high level to the low level at the start of writing. Thus, in the semiconductor storage device according to the first embodiment, the write margin of the memory cell can be increased.

Further, in the semiconductor storage device according to the first embodiment, each capacitor is achieved by using a parasitic capacitance of a line, thereby mounting each capacitor without increasing the circuit area. In this regard, the layout of the memory cell MC of the semiconductor storage device according to the first embodiment will be described in detail below.

Figure 4:
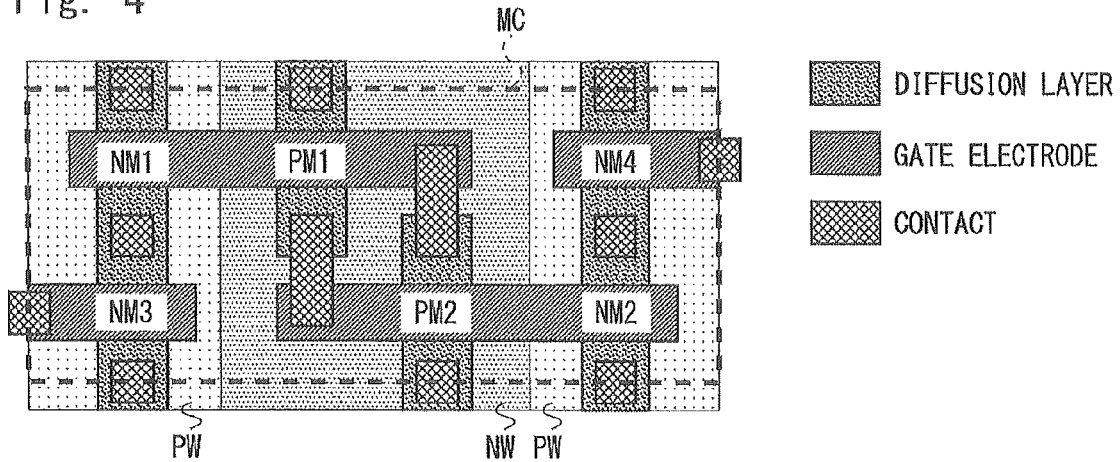
FIG. 4 is a schematic diagram showing a layout of layers including a contact layer of a memory cell of the semiconductor storage device according to the first embodiment.

First, FIG. 4 is a schematic diagram showing a layout of layers including a contact layer of a memory cell of the semiconductor storage device according to the first embodiment. As shown in FIG. 4, in the memory cell MC according to the first embodiment, a P-well PW formed of a first conductivity type (for example, P-type) semiconductor and an N-well NW formed of a second conductivity type (for example, N-type) semiconductor are formed on a semiconductor substrate. In a region in which a single memory cell MC is formed, an N-well NW is formed so as to be sandwiched between P-wells PW.

In one of the P-wells PW, the first drive transistor NM1 and the first transfer transistor NM3 are formed. The diffusion layer of the first drive transistor NW1 and the diffusion layer of the first transfer transistor NM3 are formed in the same column. The drain of the first drive transistor NM1 and one terminal of the first transfer transistor NM3 are formed on one diffusion layer region. In the other P-well PW, the second drive transistor NM2 and the second transfer transistor NM4 are formed. The diffusion layer of the second drive transistor NM2 and the diffusion layer of the second transfer transistor NM4 are formed in the same column. The drain of the second drive transistor NM2 and one terminal of the second transfer transistor NM4 are formed in one diffusion layer region.

In the N-well NW, the first load transistor PM1 and the second load transistor PM2 are formed. The diffusion layer of the first load transistor PM1 and the diffusion layer of the second load transistor PM2 are independently formed.

In the memory cell MC, the gate of the first drive transistor NM1 and the gate of the first load transistor PM1 are integrally formed. The gate of the second drive transistor NM2 and the gate of the second load transistor PM2 are integrally formed. The gate of the first transfer transistor NM3 and the gate of the second transfer transistor NM4 are independently formed.

In the memory cell MC, contacts which connect each diffusion layer with each line formed in the upper layer are formed on the source and drain of each transistor. In this case, in the memory cell MC, the drain of the first load transistor PM1 and the gates of the second load transistor PM2 and the second drive transistor NM2 are connected via a contact. The drain of the second load transistor PM2 and the gates of the first load transistor PM1 and the first drive transistor NM1 are connected via a contact. A single contact commonly used for two terminals is formed on the drain of the first drive transistor NM1 and one terminal of the first transfer. A single contact commonly used for two terminals is formed on the drain of the second drive transistor NM2 and one terminal of the second transfer transistor NM4.

Figure 5:
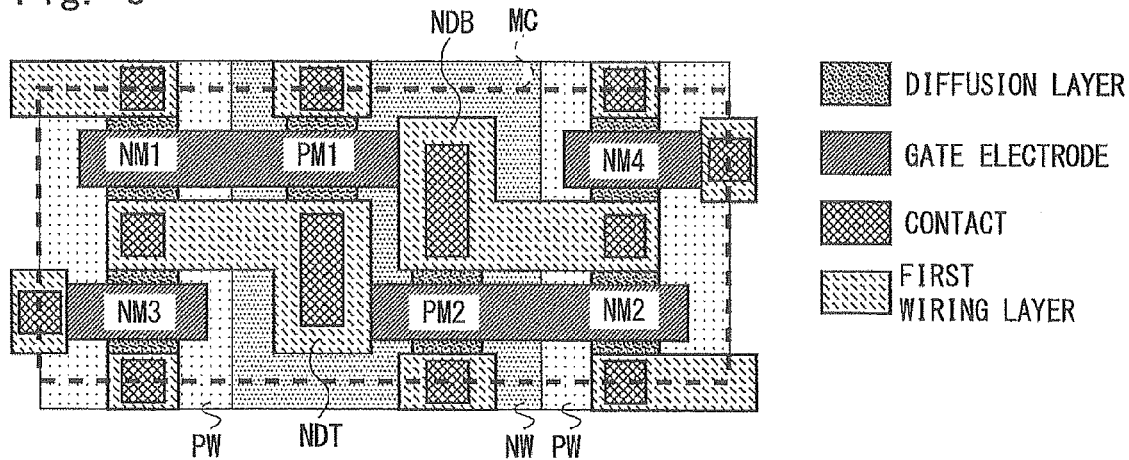
FIG. 5 is a schematic diagram showing a layout of layers including a first wiring layer of the memory cell of the semiconductor storage device according to the first embodiment.

Next, FIG. 5 is a schematic diagram showing a layout of layers including a first wiring layer of the memory cell of the semiconductor storage device according to the first embodiment. As shown in FIG. 5, in the memory cell MC according to the first embodiment, the first cell node line NDT and the second cell node line NDB are formed in the first wiring layer. The first cell node line NDT is formed so as to connect the drain of the first load transistor PM1, the drain of the first drive transistor NM1, the gate of the second load transistor PM2, the gate of the second drive transistor NM2, and one terminal of the first transfer transistor NM3 to each other. The second cell node line NDB is formed so as to connect the drain of the second load transistor PM2, the drain of the second drive transistor NM2, the gate of the first load transistor PM1, the gate of the first drive transistor NM1, and one terminal of the second transfer transistor NM4 to each other.

In the memory cell MC, the source of the first drive transistor NM1 and the source of the second drive transistor NM2 are each provided with a line which allows the ground line to be pulled in. The gate of the first transfer transistor NM3 and the gate of the second transfer transistor NM4 are each provided with a line which connects a word line with each gate. Another terminal of the first transfer transistor NM3 and another terminal of the second transfer transistor NM4 are each provided with a line which connects a bit line with each another terminal. The source of the first load transistor PM1 and the source of the second load transistor PM2 are each provided with a line which connects each source with a power supply line.

Figure 6:
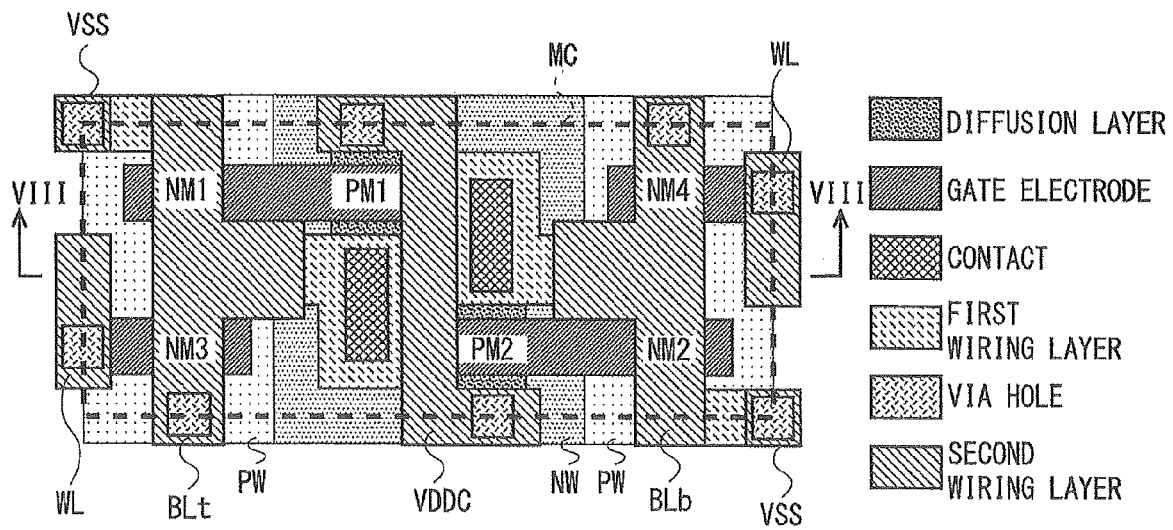
FIG. 6 is a schematic diagram showing a layout of layers including a second wiring layer of the memory cell of the semiconductor storage device according to the first embodiment.

Next, FIG. 6 is a schematic diagram showing a layout of layers including a second wiring layer of the memory cell of the semiconductor storage device according to the first embodiment. As shown in FIG. 6, in the memory cell MC according to the first embodiment, lines of the first wiring layer and lines of the second wiring layer are connected to each other through via holes. In the second wiring layer, the first bit line BLt, the second bit line BLb, the first power supply line (for example, the power supply line VDDC within the cell), the second power supply line (for example, the ground line), and lines respectively connected to the word lines are formed.

The first bit line BLt is formed so as to be aligned with the via hole connected to another terminal of the first drive transistor NM3. The second bit line BLt is formed so as to be aligned with the via hole connected to another terminal of the second drive transistor NM4. The first bit line BLt and the second bit line BLb are formed in common with the bit lines of other memory cells (not shown). The first bit line BLt and the second bit line BLb are formed with a longitudinal direction thereof set in a direction perpendicular to the longitudinal direction of each of the first cell node line NDT and the second cell node line NDB (the direction in which the cell node lines extend). The first bit line BLt has a first wide portion at a portion where the first bit line BLt overlaps the first cell node line NDT in a region in which a single memory cell MC is formed. The first wide portion is formed with a line width greater than that of other portions of the first bit line BLt. The second bit line BLb has a second wide portion at a portion where the second bit line BLb overlaps the second cell node line NDB in a region in which a single memory cell MC is formed. The second wide portion is formed with a line width greater than that of other portions of the second bit line BLb.

Note that in the description of embodiments, the line width of each bit line corresponds to the distance of a line in a direction perpendicular to the longitudinal direction of each bit line (for example, the horizontal direction in FIG. 6). Since the direction perpendicular to each bit line corresponds to the longitudinal direction of each cell node line, the line width of each cell node line corresponds to the distance of a line in a direction perpendicular to the longitudinal direction of each cell node line (for example, the vertical direction in FIG. 6).

The power supply line VDDC within the cell is formed so as to connect the source of the first load transistor PM1 and the source of the second load transistor PM2 to each other. The power supply line with the cell is connected to a power supply line (not shown) in the upper layer through a via hole (not shown). A ground line is formed on each of the source of the first drive transistor NM1 and the source of the second drive transistor NM2. The ground line is connected to a ground line (not shown) in the upper layer through a via hole (not shown). A line connected to the word line WL is formed on each of the gate of the first transfer transistor NM3 and the gate of the second transfer transistor NM4. The line connected to the word line WL is connected to a word line (not shown) in the upper layer through a via hole (not shown).

Figure 7:
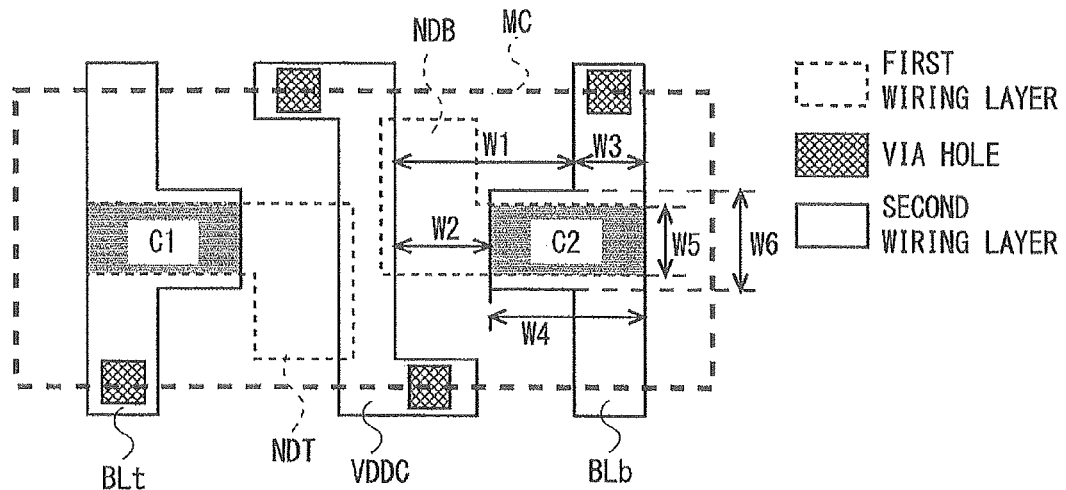
FIG. 7 is a diagram illustrating a layout of capacitors provided in the memory cell of the semiconductor storage device according to the first embodiment.

The shape of the first and second wide portions will now be described in more detail. FIG. 7 shows a diagram illustrating a layout of capacitors provided in the memory cell MC of the semiconductor storage device according to the first embodiment. As shown in FIG. 7, in the memory cell MC according to the first embodiment, the first capacitor C1 is formed at a portion where the first cell node line NDT and the first bit line BLt overlap each other. The second capacitor C2 is formed at a portion where the second cell node line NDB and the second bit line BLb overlap each other.

The wide portions are respectively formed at portions where the cell node lines and the bit lines overlap each other. The wide portions each have a first side opposed to the power supply line VDDC, and a second side which is a portion of each bit line other than the wide portion and is opposed to the power supply line. A distance W2 between the first side and the power supply line VDDC is set to be shorter than a distance W1 between the second side and the power supply line VDDC. A line width W4 of each wide portion is greater than a width W3 of each bit line at a portion other than the wide portion. Assuming that the longitudinal direction of each bit line is a first direction, a width W6 of each wide portion in the first direction is set to be greater than a width W5 of the corresponding cell node line in the first direction. In the memory cell MC according to the first embodiment, each wide portion is formed with the direction in which the distance between the wide portion and the power supply line VDDC within the cell decreases being set in the convex direction. The width W5 corresponds to the line width of the corresponding cell node line, and the width W6 corresponds to the line length of each wide portion in the line length of the corresponding bit line.

Figure 8:
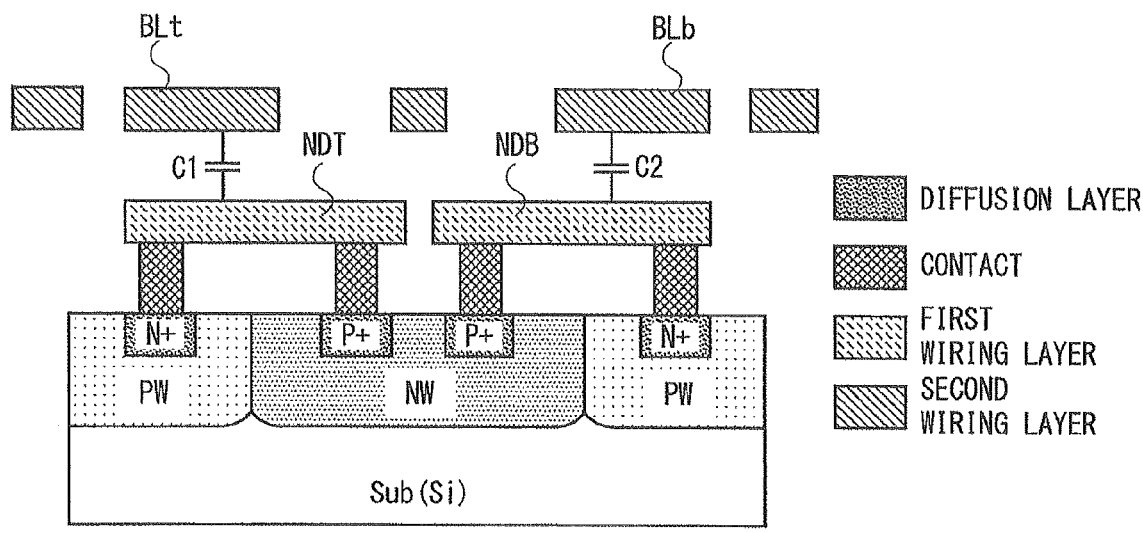
FIG. 8 is a sectional view of the memory cell of the semiconductor storage device according to the first embodiment taken along the line VIII-VIII of FIG. 6.

Next, FIG. 8 shows a sectional view of the memory cell MC of the semiconductor storage device according to the first embodiment taken along the line VIII-VIII of FIG. 6. As shown in FIG. 8, in the memory cell MC, P-wells PW and N-wells NW are formed in a surface layer portion of a semiconductor substrate Sub. An N+ diffusion layer serving as the source or drain of drive transistors and transfer transistors is formed in each P-well PW, A P+ diffusion layer serving as the source or drain of load transistors is formed in each N-well NW. The N+ diffusion layer and the P+ diffusion layer are formed so as to be exposed to the surface of the semiconductor substrate Sub. The N+ diffusion layer and the P+ diffusion layer are connected to the first cell node line NDT and the second cell node line NDB via contacts formed in the upper layer. The first cell node line NDT and the second cell node line NDB are formed in the first wiring layer. The second wiring layer is formed above the first Wiring layer. In the second wiring layer, at least the first bit line BLt and the second bit line BLb are formed. Although not shown, an interlayer insulating film for preventing short-circuiting between lines is formed between the first wiring layer and the second wiring layer.

The first capacitor C1 is formed at a position corresponding to the first wide portion of the first bit line BLt. The first capacitor C1 functions using the interlayer insulating film as a dielectric film, and is provided between the first cell node line NDT and the first bit line BLt. The second capacitor C2 is formed at a position corresponding to the second wide portion of the second bit line BLb. The second capacitor C2 functions using the interlayer insulating film as a dielectric film, and is provided between the second cell node line NDB and the second bit line BLb. The first capacitor C1 and the second capacitor C2 are each formed between a bit line and a cell node line which are connected when a transfer transistor is rendered conductive.

As described above, in the memory cell MC according to the first embodiment, the first capacitor C1 and the second capacitor C2, which increase the write margin of the memory cell, are achieved by capacitances between lines. In the memory cell MC according to the first embodiment, the bit lines are respectively provided with the wide portions so as to increase the capacitances between lines. To provide the wide portions, there is no need to shift the location of each transistor or the location of each line within the memory cell so as to increase the memory cell layout region. In other words, the use of the memory cell MC according to the first embodiment makes it possible to achieve a memory with an increased write margin, without increasing the circuit area.

Second Embodiment

Figure 9:
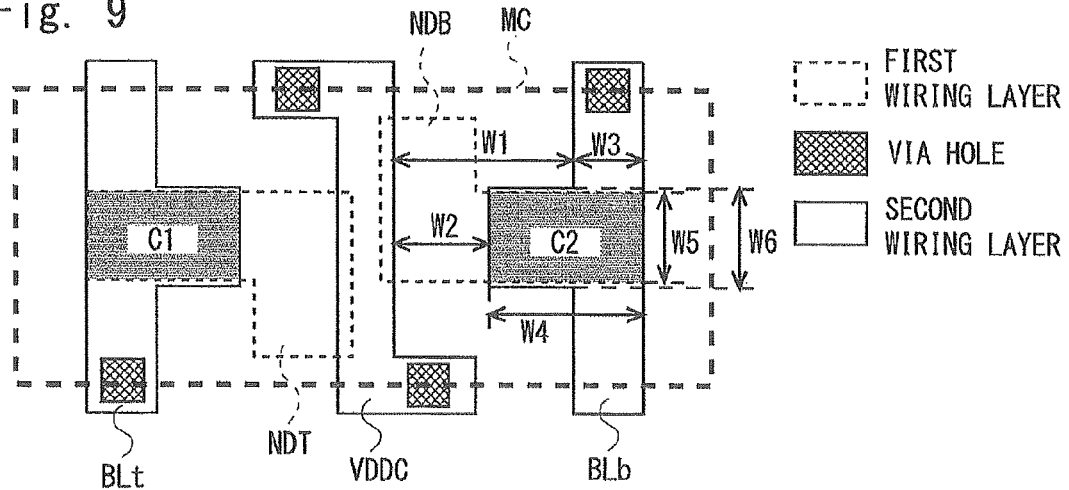
FIG. 9 is a diagram illustrating a layout of capacitors provided in a memory cell of a semiconductor storage device according to a second embodiment.

In a second embodiment, another form of the layout of the memory cell MC according to the first embodiment will be described. FIG. 9 shows a schematic diagram of the layout of the first capacitor C1 and the second capacitor C2 in the memory cell MC according to the second embodiment.

The schematic diagram of the layout shown in FIG. 9 corresponds to the diagram shown in FIG. 7 illustrating the layout of the capacitors provided in the memory cell MC according to the first embodiment. As shown in FIG. 9, in the memory cell MC according to the second embodiment, the width W5 in the first direction of each of the first cell node line NDT and the second cell node line NDB (for example, a direction in parallel with the longitudinal direction of each bit line) is made as close as possible to the width W6 in the first direction of the wide portion. Thus, in the memory cell MC according to the second embodiment, the capacitance values of the first capacitor C1 and the second capacitor C2 can be increased by increasing the area of the portion where the wide portion of each bit line and the corresponding cell node line overlap each other.

Third Embodiment

Figure 10:
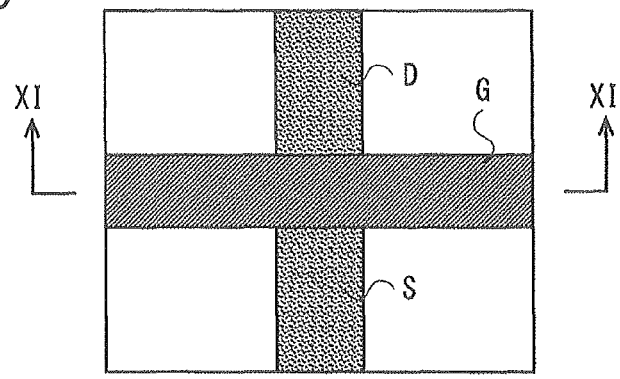
FIG. 10 is a diagram illustrating the shape of a transistor used in a memory cell of a semiconductor storage device according to a third embodiment.
Figure 11:
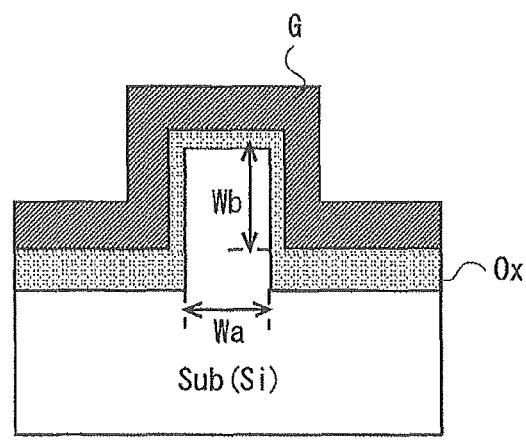
FIG. 11 is a sectional view of the transistor taken along the line XI-XI of FIG. 10.
Figure 12:
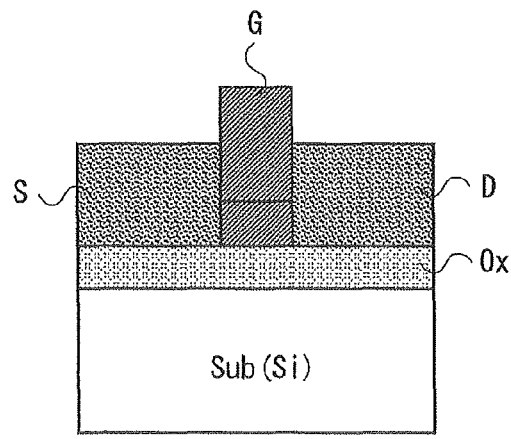
FIG. 12 is a diagram illustrating the shape of the transistor shown in FIG. 10 when viewed from a side thereof.

In a third embodiment, an example in which a multi-gate element is used as a transistor constituting the memory cell MC will be described. In the multi-gate element, a plurality of gates are provided to a plurality of surfaces, thereby achieving a reduction in an off-state leakage current and an increase in an on-state current. An example in which a transistor having a fin structure is used as the multi-gate element will be described below. FIGS. 10 to 12 show diagrams illustrating the configuration of the transistor having the fin structure.

FIG. 10 shows a diagram illustrating the shape of a transistor used in the memory cell of the semiconductor storage device according to the third embodiment. FIG. 10 shows the shape of the transistor when viewed from above (in the direction of looking down a circuit element forming surface). The transistor having the fin structure as shown in FIG. 10 is formed of a diffusion layer in which a source S and a drain D are formed in the fin structure, and a gate G extending in a direction perpendicular to the diffusion layer.

Next, FIG. 11 shows a sectional view of the transistor taken along the line XI-XI of FIG. 10. As shown in FIG. 11, the gate G is formed in a rectangular shape so as to surround the wide portion formed on the semiconductor substrate. Further, a gate oxide film Ox is formed between the semiconductor substrate and the gate G. The gate width of the transistor having the fin structure is determined by a width Wa at an upper end side of the wide portion and a length Wb in parallel to the gate G of the wall surface of the wide portion. That is, in the example shown in FIG. 11, the gate width is represented by Wa+2Wb.

Next, FIG. 12 shows a diagram illustrating the shape of the transistor shown in FIG. 10 when viewed from a side thereof. As shown in FIG. 12, the transistor having the fin structure has the source S and the drain D which are formed with the gate G interposed therebetween.

In the transistor having the fin structure, the area where the diffusion region, in which the source S and the drain D are formed, contacts the semiconductor substrate Sub is small, which makes it possible to reduce the parasitic capacitance of each of the source S and the drain D. The transistor having the fin structure has a gate width smaller than the area of the device. Accordingly, when the device is miniaturized, the current driving ability can be increased while the leak current is reduced, as compared with a planar-type transistor of related art.

In the memory cell MC according to the third embodiment, the memory cell shown in FIG. 2 is formed using the transistor having the fin structure described above. Thus, the circuits of the memory cell MC according to the third embodiment are identical with those shown in FIG. 2, and so the description thereof is omitted.

Figure 13:
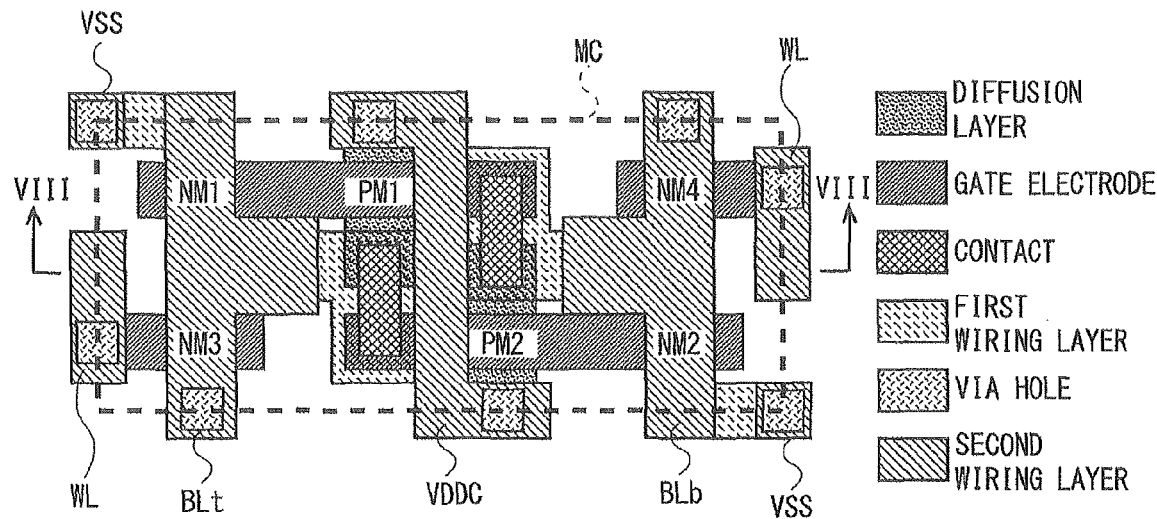
FIG. 13 is a schematic diagram showing a layout of layers including a second wiring layer of the memory cell of the semiconductor storage device according to the third embodiment.

Next, the layout of the memory cell MC according to the third embodiment will be described. FIG. 13 shows a schematic diagram of a layout of layers including the second wiring layer of the memory cell of the semiconductor storage device according to the third embodiment. As shown in FIG. 13, the layout of the memory cell MC according to the third embodiment is the same as that of the memory cell MC according to the first embodiment, except that the P-well PW and the N-well NW are not formed. While the example shown in FIG. 13 has the same size as the memory cell MC according to the first embodiment shown in FIG. 6, the memory cell MC according to the third embodiment has an area smaller than that of the memory cell MC according to the first embodiment. The distance between lines or the thickness of each line can be changed as needed depending on the manufacturing process and design specifications.

Figure 14:
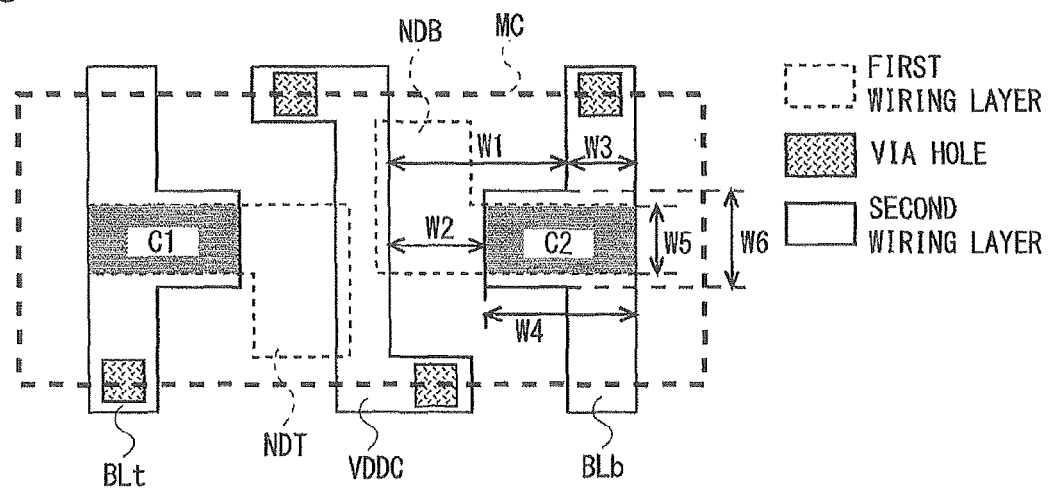
FIG. 14 is a diagram illustrating a layout of capacitors provided in the memory cell of the semiconductor storage device according to the third embodiment.

Next, FIG. 14 shows a diagram illustrating the layout of the capacitors provided in the memory cell of the semiconductor storage device according to the third embodiment. As shown in FIG. 14, also in the memory cell MC according to the third embodiment, the first capacitor C1 and the second capacitor C2 are formed in the portion where bit lines and cell node lines overlap each other, as in the memory cell MC according to the first embodiment. The first bit line BLt and the second bit line BLb include a wide portion having a wide line width at a portion where the bit lines overlap the respective cell nodes.

In the third embodiment, a transistor having a fin structure is used as a transistor constituting the memory cell MC. The transistor having the fin structure has a feature that the parasitic capacitance of each of the source and drain thereof is small. That is, in each memory cell MC according to the third embodiment, the parasitic capacitance Cn of each of the source and drain is smaller than that of the memory cell MC according to the first embodiment. Accordingly, in the memory cell MC according to the third embodiment, the decreased voltage dV of each cell node at the start of writing, which is calculated by the expression (1), can be increased as compared with the memory cell MC according to the first embodiment. For example, the decreased voltage dV of each cell node at the start of writing can be increased from about 80 mV to 100 mV.

In other words, the use of the memory cell MC according to the third embodiment makes it possible to secure a write margin higher than that of the memory cell MC according to the first embodiment.

Fourth Embodiment

Figure 15:
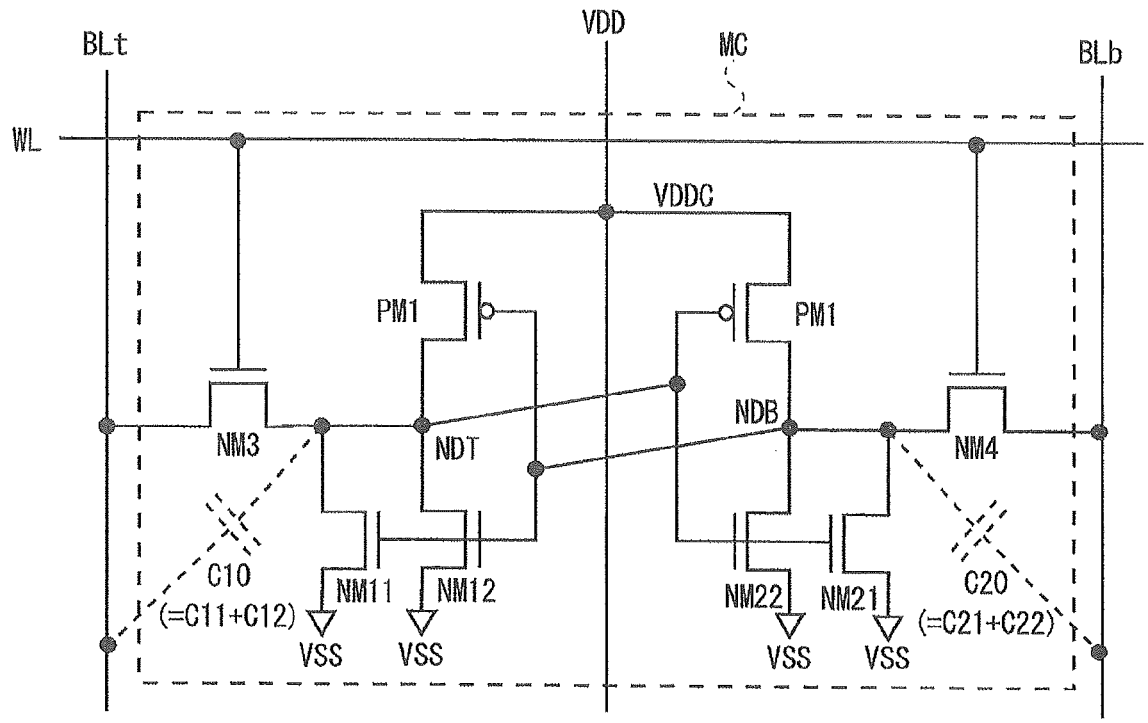
FIG. 15 is a circuit diagram of a memory cell of a semiconductor storage device according to a fourth embodiment.

In a fourth embodiment, another form of the memory cell MC incorporating transistors having a fin structure will be described. FIG. 15 shows a circuit diagram of a memory cell of a semiconductor storage device according to the fourth embodiment. As shown in FIG. 15, the memory cell MC according to the fourth embodiment is composed of two first drive transistors and two second drive transistors.

In the example shown in FIG. 15, the first drive transistors include drive transistors NM11 and NM12. The second drive transistors include drive transistors NM21 and NM22.

The gate width of each transistor having the fin structure is determined by the height and width of a portion having a fin shape (hereinafter referred to as "fin portion") in which a diffusion layer serving as the source and drain is formed. In this case, to achieve further miniaturization, it is difficult to increase the width of the fin portion. Further, since the shape of the fin portion is determined depending on the processes, it is difficult to change the height of the fin portion depending on the required driving ability. Accordingly, in the memory cell MC according to the fourth embodiment, the current driving ability on the side of the drive transistors of the memory cell MC is increased by connecting the transistors in parallel.

As shown in FIG. 15, in the memory cell according to the fourth embodiment, a first capacitor C10, which is formed between the first cell node line NDT and the first bit line BLt, is mounted as a combined capacitor of a first divided capacitor C11 and a second divided capacitor C12. Further, in the memory cell according to the fourth embodiment, a second capacitor C20, which is formed between the second cell node line NDB and the second bit line BLb, is mounted as a combined capacitor of a third divided capacitor C21 and a fourth divided capacitor C22.

Next, the layout of the memory cell MC according to the fourth embodiment will be described in further detail. The layout of the memory cell MC according to the fourth embodiment is substantially the same as that of the memory cell MC according to the first embodiment shown in FIGS. 4 to 6, except that they are partially different from each other. Only the differences between the memory cell MC according to the first embodiment and the memory cell MC according to the fourth embodiment will be described below.

Figure 16:
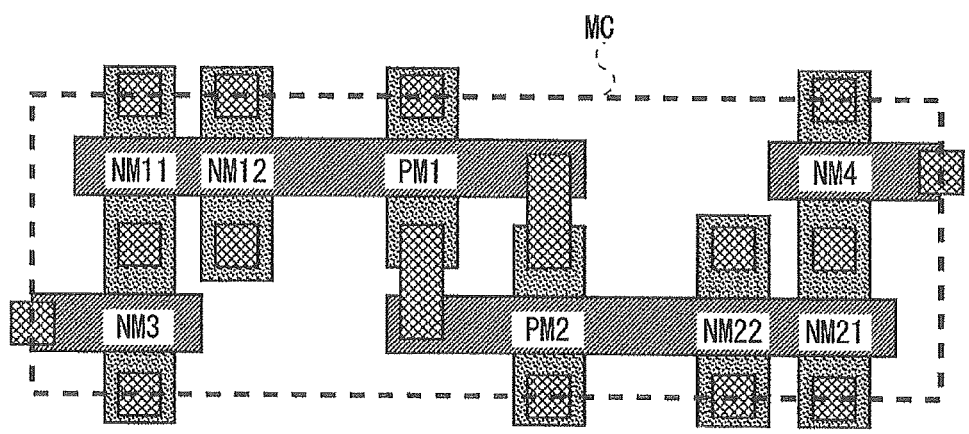
FIG. 16 is a schematic diagram showing a layout of layers including the contact layer of the memory cell of the semiconductor storage device according to the first embodiment.

FIG. 16 shows a schematic diagram showing a layout of layers including the first wiring layer of the memory cell of the semiconductor storage device according to the fourth embodiment. As shown in FIG. 16, in the memory cell MC according to the fourth embodiment, the drive transistor NM11 is disposed in place of the first drive transistor NM1 according to the first embodiment shown in FIG. 4. The drive transistor NM12 is formed between the drive transistor NM11 and the first load transistor PM1. The gates of the drive transistors NM11 and NM12 and the gate of the load transistor PM1 are integrally formed.

In the memory cell MC according to the fourth embodiment, the drive transistor NM21 is disposed in place of the second drive transistor NM2 according to the first embodiment shown in FIG. 4. The drive transistor NM22 is formed between the drive transistor NM21 and the first load transistor PM2. The gates of the drive transistors NM21 and NM22 and the gate of the load transistor PM2 are integrally formed.

Figure 17:
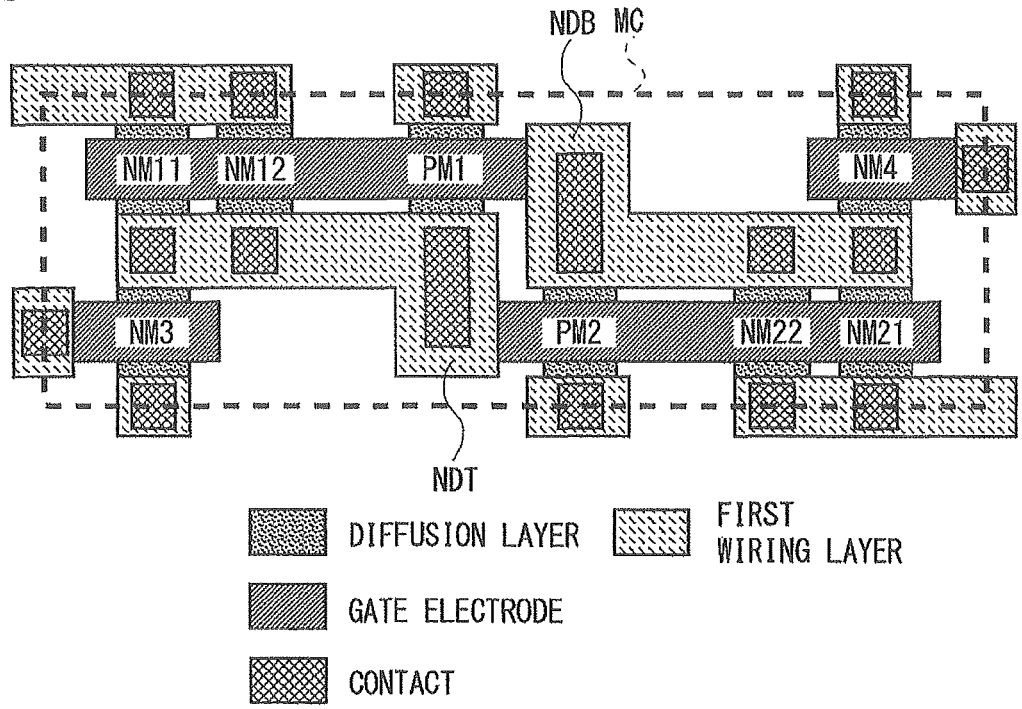
FIG. 17 is a schematic diagram showing a layout of layers including a first wiring layer of the memory cell of the semiconductor storage device according to the fourth embodiment.

Next, FIG. 17 is a schematic diagram showing a layout of layers including the first wiring layer of the memory cell of the semiconductor storage device according to the fourth embodiment. As shown in FIG. 17, in the memory cell MC according to the fourth embodiment, the first cell node line NDT is formed so as to connect the drain of the first load transistor PM1, the drains of the drive transistors NM11 and NM12, the gate of the second load transistor PM2, the gates of the drive transistors NM21 and NM21, and one terminal of the first transfer transistor NM3 to each other. The second cell node line NDB is formed so as to connect the drain of the second load transistor PM2, the drains of the drive transistors MN21 and NM22, the gate of the first load transistor PM1, the gates of the drive transistors NM11 and NM12, and one terminal of the second transfer transistor NM4 to each other.

Figure 18:
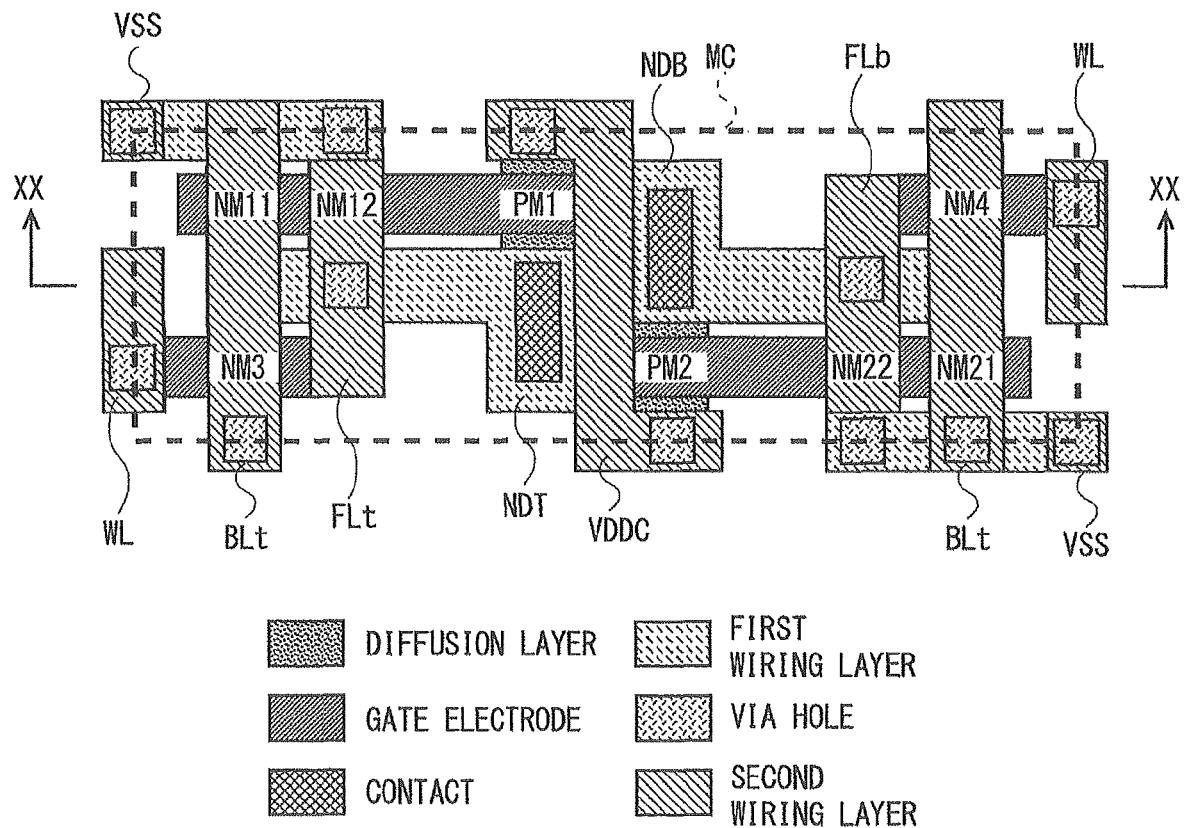
FIG. 18 is a schematic diagram showing a layout of layers including a second wiring layer of the memory cell of the semiconductor storage device according to the fourth embodiment.

Next, FIG. 18 is a schematic diagram showing a layout of layers including the second wiring layer of the memory cell of the semiconductor storage device according to the fourth embodiment. As shown in FIG. 18, the memory cell MC according to the fourth embodiment includes a first line FLt and a second capacitor line FLb, as well as the memory cell MC according to the first embodiment. The first capacitor line FLt is formed at a position adjacent to the first bit line BLt, with the longitudinal direction of the first capacitor line FLt being set in a direction parallel to the first bit line BLt. The first capacitor line FLt is connected to the first cell node line NDT through a via hole. The first capacitor line FLt is formed within a region in which the memory cell itself is formed, and is not connected to any lines in other regions. In the example shown in FIG. 18, the first capacitor line FLt is located at a position closer to the power supply line VDDC within the cell than the position of the first bit line BLt.

The second capacitor line FLt is formed at a position adjacent to the second bit line BLb, with the longitudinal direction of the second capacitor line FLt being set in a direction parallel with the second bit line BLb. The second capacitor line FLt is connected to the first cell node line NDB through a via hole. The second capacitor line FLb is formed within a region in which the memory cell itself is formed, and is not connected to any lines in other regions. In the example shown in FIG. 18, the second capacitor line FLb is located at a position closer to the power supply line VDDC within the cell than the position of the first bit line BLb.

The first bit line BLt is formed in a wiring layer different from that of the first cell node line NDT, and has a portion where the first bit line BLt overlaps the first cell node line NDT when viewed from above. The second bit line BLb is formed in a wiring layer different from that of the second cell node line NDB, and has a portion where the second bit line BLb overlaps the second cell node line NDB when viewed from above.

Figure 19:
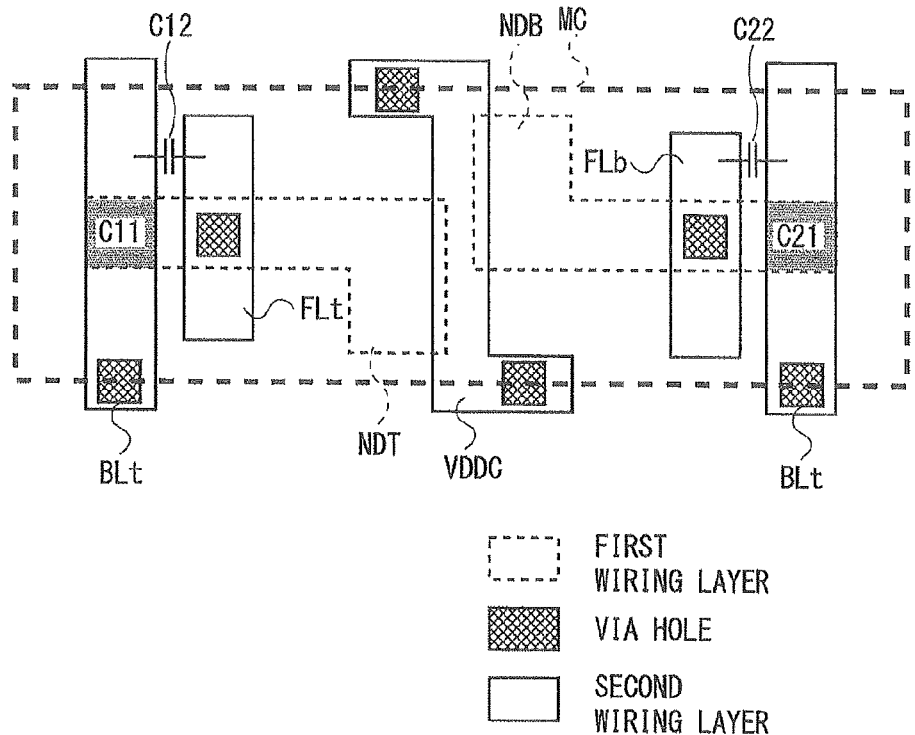
FIG. 19 is a diagram illustrating a layout of capacitors provided in the memory cell of the semiconductor storage device according to the fourth embodiment.

In the memory cell MC according to the fourth embodiment, one of the capacitors forming the combined capacitor is formed in the portion where the bit lines and the cell node lines overlap each other, and the other of the capacitors forming the combined capacitor is formed in the portion where the bit lines and the capacitor lines are parallel to each other. A specific configuration of each capacitor used in the memory cell MC according to the fourth embodiment will be described in detail. FIG. 19 shows a diagram illustrating the layout of the capacitors provided in the memory cell of the semiconductor storage device according to the fourth embodiment.

As shown in FIG. 19, in the memory cell MC according to the fourth embodiment, the first divided capacitor C11 in the first capacitor C10 is formed in the portion where the first bit line BLt and the first cell node line NDT overlap each other, and the second divided capacitor C12 in the first capacitor C10 is formed between the first bit line BLt and the first capacitor line FLt. In this case, the first divided capacitor C11 is formed between the first cell node line NDT and the first bit line BLt, and one terminal of the second divided capacitor C12 is connected to the first cell node line NDT through the first capacitor line FLt and the other terminal of the second divided capacitor C12 is connected to the first bit line BLt.

In the memory cell MC according to the fourth embodiment, the third divided capacitor C21 in the second capacitor C20 is formed in the portion where the second bit line BLb and the second cell node line NDB overlap each other, and the fourth divided capacitor C22 in the second capacitor C20 is formed between the second bit line BLb and the second capacitor line FLb. In this case, the third divided capacitor C21 is formed between the second cell node line NDB and the second bit line BLb, and one terminal of the fourth divided capacitor C22 is connected to the second cell node line NDT through the second capacitor line HLb and the other terminal of the fourth divided capacitor C22 is connected to the second bit line BLb.

Figure 20:
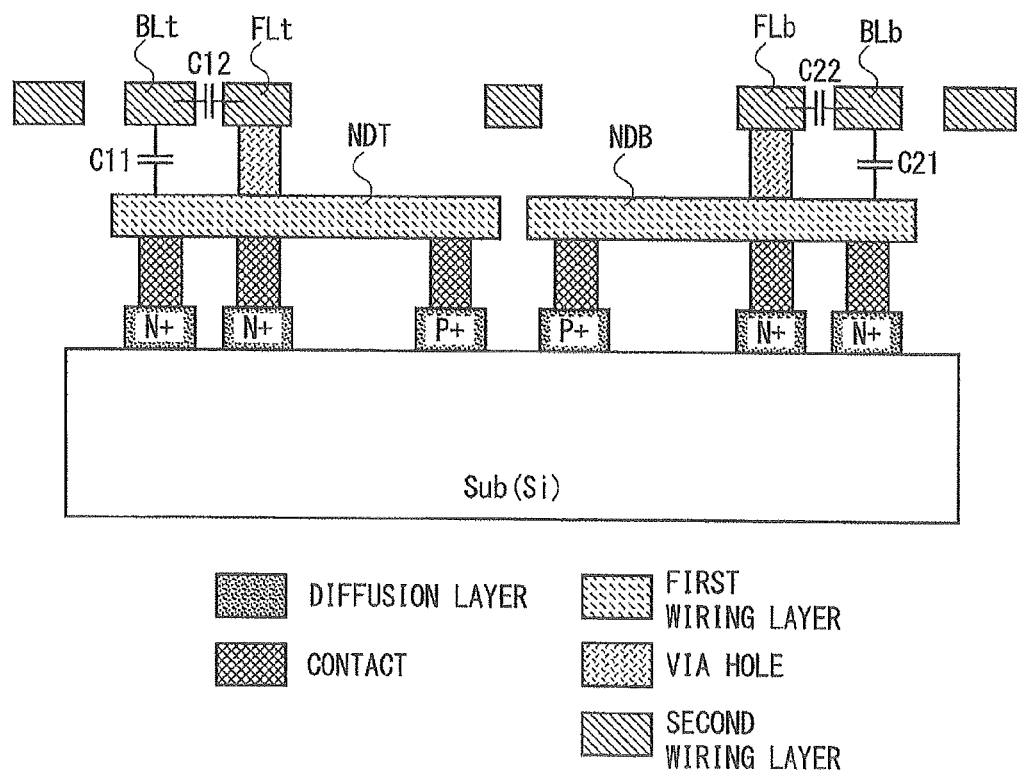
FIG. 20 is a sectional view of the memory cell of the semiconductor storage device according to the fourth embodiment taken along the line XX-XX of FIG. 18.

Next, FIG. 20 shows a sectional view of the memory cell of the semiconductor storage device according to the fourth embodiment taken along the line XX-XX of FIG. 18. As shown in FIG. 20, in the memory cell MC according to the fourth embodiment, the first cell node line NDT and the second cell node line NDB are formed in the first wiring layer. In the memory cell MC according to the fourth embodiment, the first bit line BLt, the second bit line BLb, the first capacitor line FLt, and the second capacitor line FLb are formed. Although not shown in the memory cell MC according to the fourth embodiment, a first interlayer insulating film is formed between the first wiring layer and the second wiring layer, and a second interlayer insulating film is formed between the second wiring layer and a third wiring layer (not shown) formed above the second wiring layer.

In the portion where the first cell node line NDT and the first bit line BLt overlap each other, the first divided capacitor C11 is formed. The first divided capacitor C11 functions using the first interlayer insulating film as a dielectric film, and constitutes the first capacitor C10 provided between the first cell node line NDT and the first bit line BLt. Between the first bit line BLt and the first capacitor line FLt, the second divided capacitor C12 is formed. The second divided capacitor C12 functions using the second interlayer insulating film as a dielectric film, and constitutes the first capacitor C10 provided between the first cell node line NDT and the first bit line BLt. In the portion where the second cell node line NDB and the second bit line BLb overlap each other, the third divided capacitor C21 is formed. The third divided capacitor C21 functions using the first interlayer insulating film as a dielectric film, and constitutes the second capacitor C20 provided between the second cell node line NDB and the second bit line BLb. Between the second bit line BLb and the second capacitor line FLb, the fourth divided capacitor C22 is formed. The fourth divided capacitor C22 functions using the second interlayer insulating film as a dielectric film, and constitutes the second capacitor C20 provided between the second cell node line NDB and the second bit line BLb.

As described above, in the memory cell MC according to the fourth embodiment, the drive transistors are composed of a plurality of transistors, which makes it possible to appropriately set the ratio between the driving ability of each load transistor and the driving ability of each drive transistor, depending on the specifications.

Further, in the memory cell MC according to the fourth embodiment, the capacitor lines respectively connected to the cell node lines are formed in parallel with the bit lines. Accordingly, in the memory cell MC according to the fourth embodiment, the capacitance values of the first capacitor C10 and the second capacitor C20 can be increased in a form different from that of the memory cell MC according to the first embodiment. In a manufacturing process using transistors having the fin structure, the line width thereof may be small and the line height thereof may be greater than the line width. Such a manufacturing process has a problem that parasitic capacitances that are formed between lines overlapping in the vertical direction are small. However, as in the memory cell MC according to the fourth embodiment, the use of parasitic capacitances formed between adjacent lines makes it possible to increase the first capacitor C10 and the second capacitor C20 and increase the write margin.

Figure 21:
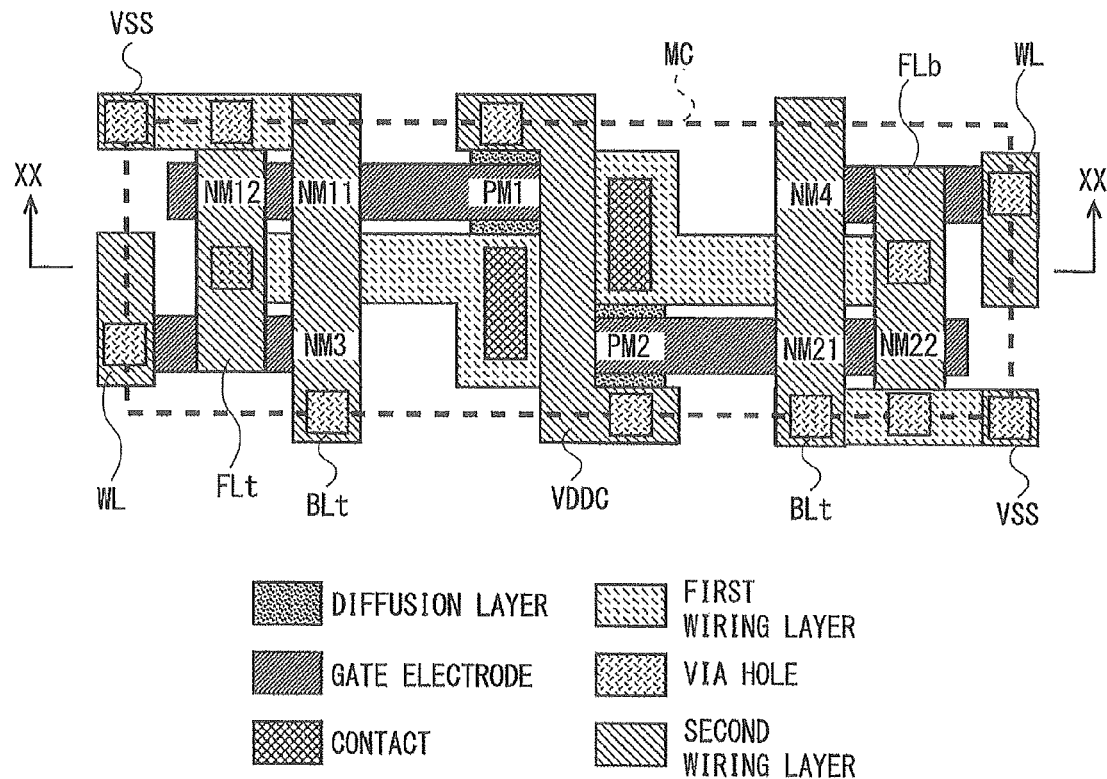
FIG. 21 is a schematic diagram showing a modified example of the layout of the memory cell of the semiconductor storage device according to the fourth embodiment.

Furthermore, in the layout of the memory cell MC according to the fourth embodiment, the capacitor lines can be formed outside the bit lines. FIG. 21 shows a modified example of the layout of the memory cell MC according to the fourth embodiment. The layout shown in FIG. 21 represents the memory cell MC in which the layers including the second wiring layer are formed as in the layout shown in FIG. 18.

In the example shown in FIG. 21, the first capacitor line FLt is located at a position farther from the power supply line VDDC within the cell than the position of the first bit line. In the example shown in FIG. 21, the second capacitor line FLb is located at a position farther from the power supply line VDDC within the cell than the second bit line BLb. In the example shown in FIG. 21, the positions of the drive transistors NM11 and NM12 are reversed depending on the positions of the capacitor lines. In the example shown in FIG. 21, the positions of the drive transistors NM21 and NM22 are also reversed.

Figure 22:
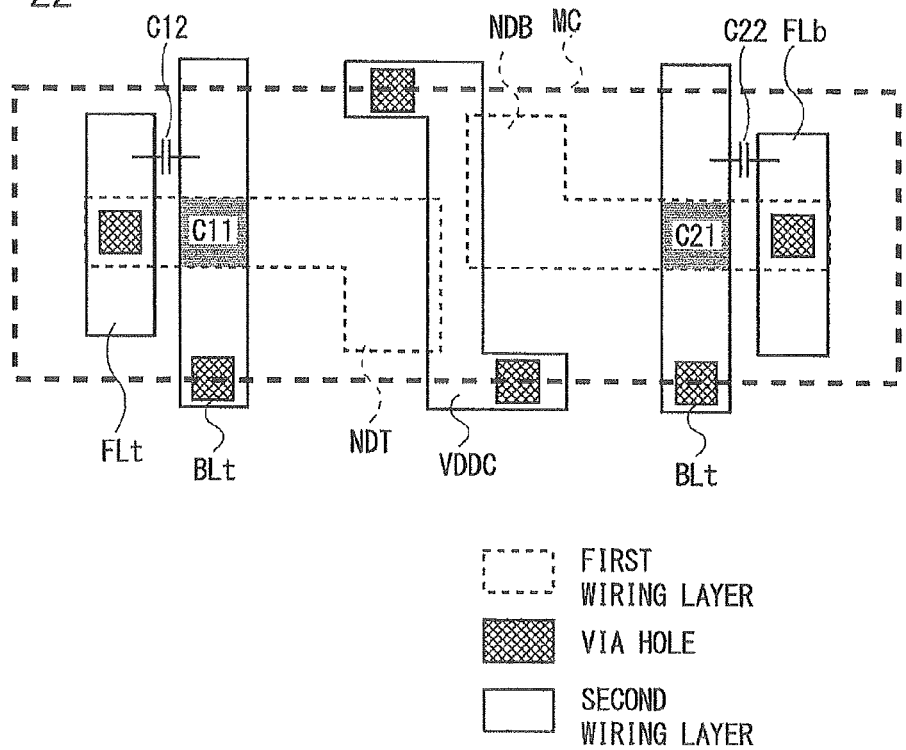
FIG. 22 is a diagram illustrating a layout of capacitors in the modified example shown in FIG. 21.

FIG. 22 shows a diagram illustrating the layout of the capacitors in the modified example shown in FIG. 21. Also in the modified example shown in FIG. 22, the first to fourth divided capacitors C11 to C22 are formed. Specifically, in the portion where the first cell node line NDT and the first bit line BLt overlap each other, the first divided capacitor C11 is formed. The first divided capacitor C11 functions using the first interlayer insulating film as a dielectric film, and constitutes the first capacitor C10 provided between the first cell node line NDT and the first bit line Int. Between the first bit line BLt and the first capacitor line FLt, the second divided capacitor C12 is formed. The second divided capacitor C12 functions using the second interlayer insulating film as a dielectric film, and constitutes the first capacitor C10 provided between the first cell node line NDT and the first bit line BLt. In the portion where the second cell node line NDB and the second bit line BLb overlap each other, the third divided capacitor C21 is formed. The third divided capacitor C21 functions using the first interlayer insulating film as a dielectric film, and constitutes the second capacitor C20 provided between the second cell node line NDB and the second bit line BLb. Between the second bit line BLb and the second capacitor line FLb, the fourth divided capacitor C22 is formed. The fourth divided capacitor C22 functions using the second interlayer insulating film as a dielectric film, and constitutes the second capacitor C20 provided between the second cell node line NDB and the second bit line BLb.

Also in the modified examples shown in FIGS. 21 and 22, the first capacitor C10 and the second capacitor C20 are formed as in the memory cells MC shown in FIGS. 19 and 20. Consequently, the capacitance values can be increased and the write margin can be increased.

Fifth Embodiment

In a fifth embodiment, another form of the shape of the region in which the first capacitor C1 and the second capacitor C2 are formed will be described. The description of the components identical with those of the other embodiments will be omitted in the description of the fifth embodiment.

Figure 23:
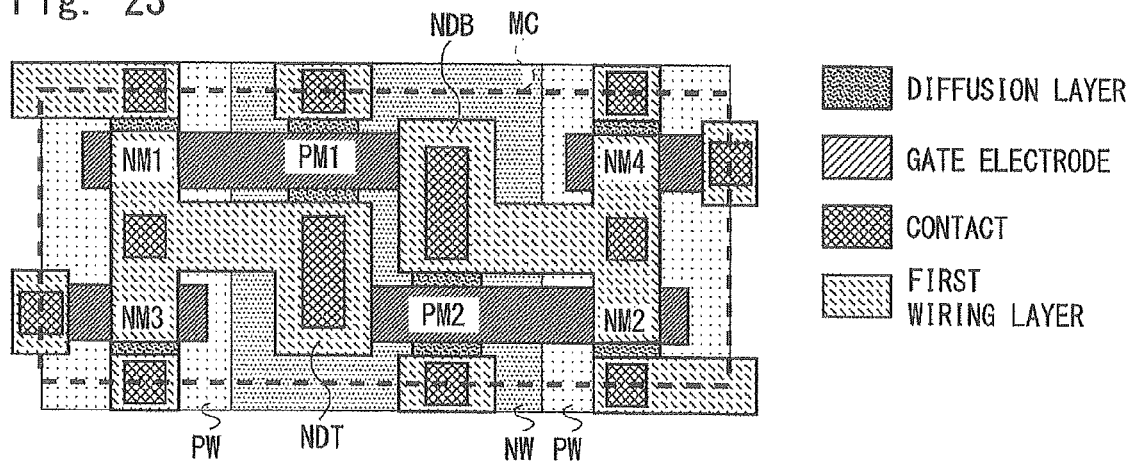
FIG. 23 is a schematic diagram showing a layout of layers including a first wiring layer of a memory cell of a semiconductor storage device according to a fifth embodiment.

FIG. 23 is a schematic diagram showing a layout of layers including the first wiring layer of the memory cell MC of the semiconductor storage device according to the fifth embodiment. As shown in FIG. 23, in the memory cell MC according to the fifth embodiment, the shapes of the first cell node line NDT and the second cell node line NDB are different from those of the other embodiments. In the memory cell MC according to the fifth embodiment, the first cell node line NDT has the first wide portion which is located above the diffusion layer in which the drive transistor NM1 and the transfer transistor NM3 are formed, and extends in a direction parallel to the direction in which the diffusion layer extends. The second cell node line NDB has the second wide portion which is located above the diffusion layer in which the drive transistor NM2 and the transfer transistor NM4 are formed, and extends in a direction parallel to the direction in which the diffusion layer extends.

The first wide portion of the first cell node line NDT is formed below the first bit line BLt, which is formed in the upper layer, so as to extend in the direction in which the first bit line BLt extends. The second wide portion of the second cell node line NDB is formed below the second bit line BLb, which is formed in the upper layer, so as to extend in the direction in which the second bit line BLb extends.

Figure 24:
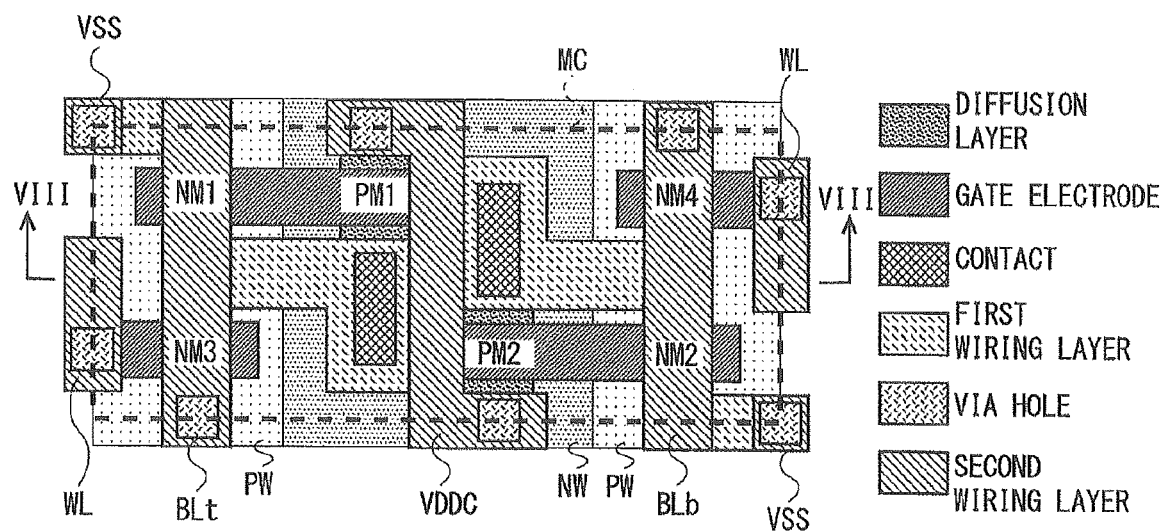
FIG. 24 is a schematic diagram showing a layout of layers including a second wiring layer of the memory cell of the semiconductor storage device according to the fifth embodiment.

Next, FIG. 24 shows a schematic diagram of a layout of layers including the second wiring layer of the memory cell MC of the semiconductor storage device according to the fifth embodiment. As shown in FIG. 24, in the memory cell MC according to the fifth embodiment, the first bit line BLt and second bit line BLb have no wide portion, and are formed so as to extend with the same line width.

Figure 25:
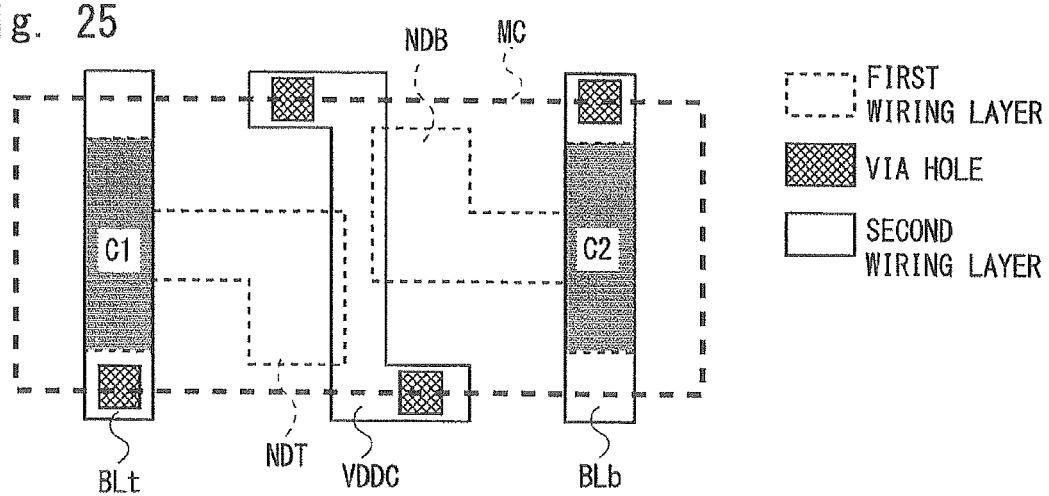
FIG. 25 is a diagram illustrating a layout of capacitors provided in the memory cell of the semiconductor storage device according to the fifth embodiment.

Next, the shapes of the first capacitor C1 and the second capacitor C2, which are formed in the memory cell MC according to the fifth embodiment including the lines as described above, will be described. FIG. 25 shows a diagram illustrating the layout of the capacitors provided in the memory cell of the semiconductor storage device according to the fifth embodiment. As shown in FIG. 25, in the memory cell MC according to the fifth embodiment, the first capacitor C1 and the second capacitor C2 are formed in such a shape that the first capacitor C1 and the second capacitor C2 are elongated in the direction in which the bit lines extend below the bit lines and are shortened in the direction perpendicular to the direction in which the bit lines extend. In the cell node lines, the first capacitor C1 and the second capacitor C2 are formed with a width greater than the width of a line portion connecting each of the drive transistors, transfer transistors, and load transistors.

As described above regarding the other embodiments, also in the memory cell MC according to the fifth embodiment, the area of each capacitor formed between the cell node lines and the bit lines can be increased, thereby achieving a memory with an increased write margin without increasing the circuit area as in the other embodiments.

Sixth Embodiment

Like in the above-described embodiments, also in a sixth embodiment, another form of the shape of the region in which the first capacitor C1 and the second capacitor C2 are formed will be described. In the sixth embodiment, the shape of each capacitor formed by combining the shape of each cell node line described in the fifth embodiment and the shape of each bit line described in the first embodiment will be described. Note that the description of the components identical with those of the other embodiments will be omitted in the description of the sixth embodiment.

Figure 26:
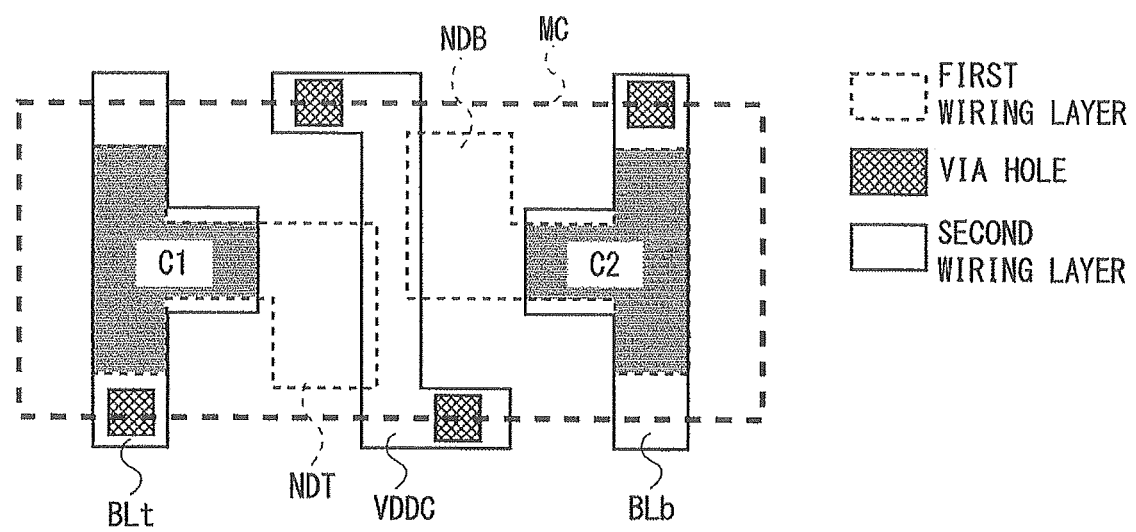
FIG. 26 is a diagram illustrating a layout of capacitors provided in a memory cell of a semiconductor storage device according to a sixth embodiment.

FIG. 26 shows a diagram illustrating the layout of the capacitors provided in the memory cell MC of the semiconductor storage device according to the sixth embodiment. As shown in FIG. 26, in the memory cell MC according to the sixth embodiment, the first capacitor C1 and the second capacitor C2 are each formed in a T-shape.

In the memory cell MC according to the sixth embodiment, the first capacitor C1 and the second capacitor C2 can be formed with an area larger than that of the other embodiments. Accordingly, the use of the memory cell MC according to the sixth embodiment makes it possible to increase the write margin as compared with the other embodiments. Meanwhile, in the memory cell MC according to the sixth embodiment, there is no need to separately form regions for capacitors so as to form the first capacitor C1 and the second capacitor C2 as in the other embodiments. Therefore, there is no adverse effect in which there is an increase in the area of the memory cell MC.

The first to sixth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

For example, in the embodiments described above, the wide portions each having a convex shape projecting toward the power supply line VDDC within the cell from the corresponding bit line have been described above. However, for example, the wide portions may have convex shapes on both sides of the wide portions in the line width direction of the corresponding bit line, or may have a convex shape at the bit line on the opposite side of the power supply line VDDC within the cell. Although the single-port SRAM has been herein illustrated, a dual-port SRAM and the like can also be used.

Moreover, the semiconductor devices according to the embodiments described above may have a configuration in which the conductivity type (p-type or n-type) of each of the semiconductor substrate, the semiconductor layer, the diffusion layer (diffusion region), and the like is inverted. Accordingly, assuming that one of the conductivity types of n-type and p-type is a first conductivity type and the other conductivity type is a second conductivity type, the first conductivity type may be p-type and the second conductivity type may be n-type, or the first conductivity type may be n-type and the second conductivity type may be p-type.

What is claimed is:

1. A semiconductor storage device comprising:
   first and second load transistors each having a source connected to a first power supply line;
   first and second drive transistors each having a source connected to a second power supply line;
   a first transfer transistor having one terminal connected to a drain of the first drive transistor and another terminal connected to a first bit line;
   a second transfer transistor having one terminal connected to a drain of the second drive transistor and another terminal connected to a second bit line;
   a first cell node line that connects a drain of the first load transistor, the drain of the first drive transistor, a gate of the second load transistor, a gate of the second drive transistor, and the one terminal of the first transfer transistor to each other; and
   a second cell node line that connects a drain of the second load transistor, the drain of the second drive transistor, a gate of the first load transistor, a gate of the first drive transistor, and the one terminal of the second transfer transistor to each other, wherein
   the first cell node line and the first bit line are formed in different wiring layers, and have a first wide portion at a portion where the first cell node line and the first bit line overlap each other when viewed from above,
   the second cell node line and the second bit line are formed in different wiring layers, and have a second wide portion at a portion where the second cell node line and the second bit line overlap each other when viewed from above,
   the first wide portion is formed with a line width greater than that of other portions of the first bit line, and
   the second wide portion is formed with a line width greater than that of other portions of the second bit line.

2. The semiconductor storage device according to claim 1, wherein
   the first bit line is formed with a longitudinal direction thereof set in a direction perpendicular to a longitudinal direction of the first cell node line, and
   the second bit line is formed with a longitudinal direction thereof set in a direction perpendicular to a longitudinal direction of the second cell node line.

3. The semiconductor storage device according to claim 1, further comprising:
   a first wiring layer in which the first cell node line and the second cell node line are formed;
   a second wiring layer in which the first bit line and the second bit line are formed; and
   an interlayer insulating film formed between the first wiring layer and the second wiring layer, wherein in the first wide portion, a first capacitor is formed between the first cell node line and the first bit line, the first capacitor functioning using the interlayer insulating film as a dielectric film, and in the second wide portion, a second capacitor is formed between the second cell node line and the second bit line, the second capacitor functioning using the interlayer insulating film as a dielectric film.

4. The semiconductor storage device according to claim 1, wherein a distance between the first power supply line and a first side opposed to the first power supply line in the first wide portion is shorter than a distance between the first power supply line and a second side opposed to the first power supply line in a portion other than the first wide portion of the first bit line.

5. The semiconductor storage device according to claim 1, wherein assuming that the longitudinal direction of the first bit line is a first direction, a width in the first direction of the first wide portion is formed to be greater than that in the first direction of the first cell node line.

6. A semiconductor storage device comprising:
first and second load transistors each having a source connected to a first power supply line;
first and second drive transistors each having a source connected to a second power supply line;
a first transfer transistor having one terminal connected to a drain of the first drive transistor, and another terminal connected to a first bit line;
a second transfer transistor having one terminal connected to a drain of the second drive transistor, and another terminal connected to a second bit line;
a first cell node line that connects a drain of the first load transistor, the drain of the first drive transistor, a gate of the second load transistor, a gate of the second drive transistor, and one terminal of the first transfer transistor to each other;
a second cell node line that connects a drain of the second load transistor, the drain of the second drive transistor, a gate of the first load transistor, a gate of the first drive transistor, and one terminal of the second transfer transistor to each other;
a first capacitor line connected to the first cell node line through a via hole, the first capacitor line being located at a position adjacent to the first bit line in the same wiring layer as that of the first bit line and formed with a longitudinal direction of the first capacitor line set in a direction parallel to the first bit line; and
a second capacitor line connected to the second cell node line through a via hole, the second capacitor line being located at a position adjacent to the second bit line in the same wiring layer as that of the second bit line and formed with a longitudinal direction of the second capacitor line set in a direction parallel to the second bit line, wherein
the first cell node line and the first bit line are formed in different wiring layers and have a portion where the first cell node line and the first bit line overlap each other when viewed from above, and
the second cell node line and the second bit line are formed in different wiring layers and have a portion where the second cell node line and the second bit line overlap each other when viewed from above.

7. The semiconductor storage device according to claim 6, wherein
the first bit line is formed with a longitudinal direction thereof set in a direction perpendicular to a longitudinal direction of the first cell node line, and
the second bit line is formed with a longitudinal direction thereof set in a direction perpendicular to a longitudinal direction of the second cell node line.

8. The semiconductor storage device according to claim 6, further comprising:
a first wiring layer in which the first cell node line and the second cell node line are formed;
a second wiring layer in which the first bit line, the second bit line, the first capacitor line, and the second capacitor line are formed;
a first interlayer insulating film formed between the first wiring layer and the second wiring layer;
a second interlayer insulating film formed between the second wiring layer and a third wiring layer formed above the second wiring layer, wherein
in the portion where the first cell node line and the first bit line overlap each other, a first divided capacitor is formed, the first divided capacitor functioning using the first interlayer insulating film as a dielectric film and constituting a first capacitor provided between the first cell node line and the first bit line, and
between the first bit line and the first capacitor line, a second divided capacitor is formed, the second divided capacitor functioning using the second interlayer insulating film as a dielectric film and constituting the first capacitor provided between the first cell node line and the first bit line,
in the portion where the second cell node line and the second bit line overlap each other, a third divided capacitor is formed, the third divided capacitor functioning using the first interlayer insulating film as a dielectric film and constituting a second capacitor provided between the second cell node line and the second bit line,
between the second bit line and the second capacitor line, a fourth divided capacitor is formed, the fourth divided capacitor functioning using the second interlayer insulating film as a dielectric film and constituting the second capacitor provided between the second cell node line and the second bit line.

9. The semiconductor storage device according to claim 6, wherein the first capacitor line and the second capacitor line are formed in a region in which a memory cell of the semiconductor storage device is formed.

10. The semiconductor storage device according to claim 6, wherein the first capacitor line and the second capacitor line are each disposed at a position closer to the first power supply line than the first bit line and the second bit line.

11. The semiconductor storage device according to claim 6, wherein the first capacitor line and the second capacitor line are each disposed at a position farther from the first power supply line than the first bit line and the second bit line.

12. A semiconductor storage device comprising:
first and second load transistors each having a source connected to a first power supply line;
first and second drive transistors each having a source connected to a second power supply line;
a first transfer transistor having one terminal connected to a drain of the first drive transistor, and another terminal connected to a first bit line;
a second transfer transistor having one terminal connected to a drain of the second drive transistor, and another terminal connected to a second bit line;
a first cell node line that connects a drain of the first load transistor, the drain of the first drive transistor, a gate of the second load transistor, a gate of the second drive transistor, and one terminal of the first transfer transistor to each other; and a second cell node line that connects a drain of the second load transistor, the drain of the second drive transistor, a gate of the first load transistor, a gate of the first drive transistor, and one terminal of the second transfer transistor to each other, wherein the first cell node line and the first bit line are formed in different wiring layers and have a first wide portion at a portion where the first cell node line and the first bit line overlap each other when viewed from above, the second cell node line and the second bit line are formed in different wiring layers and have a second wide portion at a portion where the second cell node line and the second bit line overlap each other when viewed from above, the first wide portion is formed at the first cell node line below the first bit line so as to extend in a direction in which the first bit line extends, and the second wide portion is formed at the second cell node line below the second bit line so as to extend in a direction in which the second bit line extends.

* * * * *